US012660148B2

(12) United States Patent
Xie et al.

(10) Patent No.: US 12,660,148 B2
(45) Date of Patent: Jun. 16, 2026

(54) LATE SRAM CUT WITH BACKSIDE CONTACT

(71) Applicant: International Business Machines Corporation, Armonk, NY (US)

(72) Inventors: Ruilong Xie, Niskayuna, NY (US);
Chanro Park, Clifton Park, NY (US);
Min Gyu Sung, Latham, NY (US);
Julien Frougier, Albany, NY (US);
Juntao Li, Cohoes, NY (US)

(73) Assignee: International Business Machines Corporation, Armonk, NY (US)

( * ) Notice: Subject to any disclaimer, the term of this patent is extended or adjusted under 35 U.S.C. 154(b) by 426 days.

(21) Appl. No.: 18/378,803

(22) Filed: Oct. 11, 2023

(65) Prior Publication Data

US 2025/0126768 A1     Apr. 17, 2025

(51) Int. Cl.
*H10B 10/00* (2023.01)
*G11C 11/408* (2006.01)

(52) U.S. Cl.
CPC ........ *H10B 10/125* (2023.02); *G11C 11/4085* (2013.01)

(58) Field of Classification Search
CPC .... G11C 11/4085; H10B 10/00; H10B 10/10; H10B 10/125; H10B 10/12; H10B 63/30; H10B 63/34; H10D 88/101; H10D 30/0191; H10D 30/6727; H10D 30/6713; H10D 30/019; H01L 2924/1437; H01L 2924/1442
See application file for complete search history.

(56) References Cited

U.S. PATENT DOCUMENTS

| | | | |
|---|---|---|---|
| 10,707,218 B2 | 7/2020 | Paul et al. | |
| 10,756,096 B2 | 8/2020 | Paul et al. | |
| 11,658,220 B2 | 5/2023 | Su et al. | |
| 2021/0111115 A1 | 4/2021 | Morrow et al. | |
| 2021/0134721 A1 | 5/2021 | Chiang et al. | |
| 2021/0202385 A1 | 7/2021 | Huang et al. | |
| 2021/0202500 A1 | 7/2021 | Chanemougame et al. | |
| 2021/0305252 A1 | 9/2021 | Chiang et al. | |
| 2021/0305262 A1 * | 9/2021 | Wang ................... | H10D 62/121 |

(Continued)

FOREIGN PATENT DOCUMENTS

| | | | | |
|---|---|---|---|---|
| TW | I758032 B | * | 3/2022 | ........... H10D 84/856 |

*Primary Examiner* — Lawrence C Tynes, Jr.

(74) *Attorney, Agent, or Firm* — Scully, Scott, Murphy & Presser, P.C.; L. Jeffrey Kelly, Esq.

(57) ABSTRACT

A SRAM is provided that includes a first pull-up transistor having a first channel length, and a first pull-down transistor located adjacent to the first pull-up transistor and having a second channel length, wherein the second channel length is greater than the first channel length. The structure further includes a first backside contact structure contacting a first n-doped source/drain region of the first pull-down transistor, wherein the first backside contact structure has a first critical dimension that is constant throughout an entirety thereof, and a second backside contact structure having a vertical portion and a base portion. The vertical portion of the second backside contact structure directly contacts a first p-doped source/drain region of the first pull-up transistor and the base portion of the second backside contact structure has a second critical dimension that is greater than the first critical dimension.

20 Claims, 34 Drawing Sheets

(56)     References Cited

U.S. PATENT DOCUMENTS

| | | | |
|---|---|---|---|
| 2021/0305381 A1 | 9/2021 | Chiang et al. | |
| 2021/0351303 A1 | 11/2021 | Ju et al. | |
| 2021/0376071 A1 | 12/2021 | Liu et al. | |
| 2021/0376093 A1 | 12/2021 | Chu et al. | |
| 2022/0328526 A1* | 10/2022 | Liaw | H10D 89/10 |
| 2022/0352180 A1* | 11/2022 | Lin | H01L 21/28088 |
| 2023/0065318 A1 | 3/2023 | Fan et al. | |
| 2023/0068359 A1 | 3/2023 | Chang et al. | |
| 2023/0105461 A1 | 4/2023 | Kim et al. | |
| 2023/0207553 A1* | 6/2023 | Xie | H10D 84/0149 |
| 2023/0345691 A1* | 10/2023 | Xie | H10D 30/6757 |
| 2024/0064953 A1* | 2/2024 | Chang | H10B 10/125 |
| 2025/0098137 A1* | 3/2025 | Wang | H10B 10/12 |

* cited by examiner

LATE SRAM CUT WITH BACKSIDE CONTACT

BACKGROUND

The present application relates to semiconductor technology, and more particularly to a static random access memory (SRAM) and a method of forming the same.

Memories devices/cells are commonly used in integrated circuits. For example, SRAM is a volatile memory device/cell, and is used in electronic applications where high speed, low power consumption, and simplicity of operation are needed. SRAM has the advantage of being able to hold data without requiring a refresh.

A SRAM is typically made up of six transistors, and is often called a 6T SRAM cell. Each bit in the cell is stored on four transistor (i.e., M1, M2, M3, M4) that form two cross-coupled inverters. This storage cell has two stable states which are used to denote 0 and 1. Two additional access transistors serve to control the access to a storage cell during read and write operations. In addition to 6T SRAM, other kinds of SRAMs use 4, 8, 10 (4T, 8T, 10T SRAM), or more transistors per bit.

SUMMARY

In one aspect of the present application, a SRAM is provided. In one embodiment, the semiconductor structure includes a first pull-up transistor having a first channel length, and a first pull-down transistor located adjacent to the first pull-up transistor and having a second channel length, wherein the second channel length is greater than the first channel length. The semiconductor structure further includes a first backside contact structure contacting a first n-doped source/drain region of the first pull-down transistor, wherein the first backside contact structure has a first critical dimension that is constant throughout an entirety of the first backside contact structure. The semiconductor structure even further includes a second backside contact structure having a vertical portion and a base portion, wherein the vertical portion of the second backside contact structure directly contacts a first p-doped source/drain region of the first pull-up transistor and the base portion of the second backside contact structure has a second critical dimension that is greater than the first critical dimension.

In addition to a SRAM, the present application also provides a semiconductor structure that includes a p-type nanosheet transistor having a first channel length and an n-type nanosheet transistor located adjacent to the p-type nanosheet transistor and having a second channel length, wherein the second channel length is greater than the first channel length. The semiconductor structure also includes a first backside contact structure contacting an n-doped source/drain region of the n-type nanosheet transistor, wherein the first backside contact structure has a first critical dimension that is constant throughout an entirety of the first backside contact structure. The semiconductor structure even further includes a second backside contact structure having a vertical portion and a base portion, wherein the vertical portion of the second backside contact structure directly contacts a p-doped source/drain region of the p-type nanosheet transistor and the base portion of the second backside contact structure has a second critical dimension that is greater than the first critical dimension.

The present application also provides a method of forming a semiconductor structure, e.g., SRAM.

DETAILED DESCRIPTION

Figure 1:
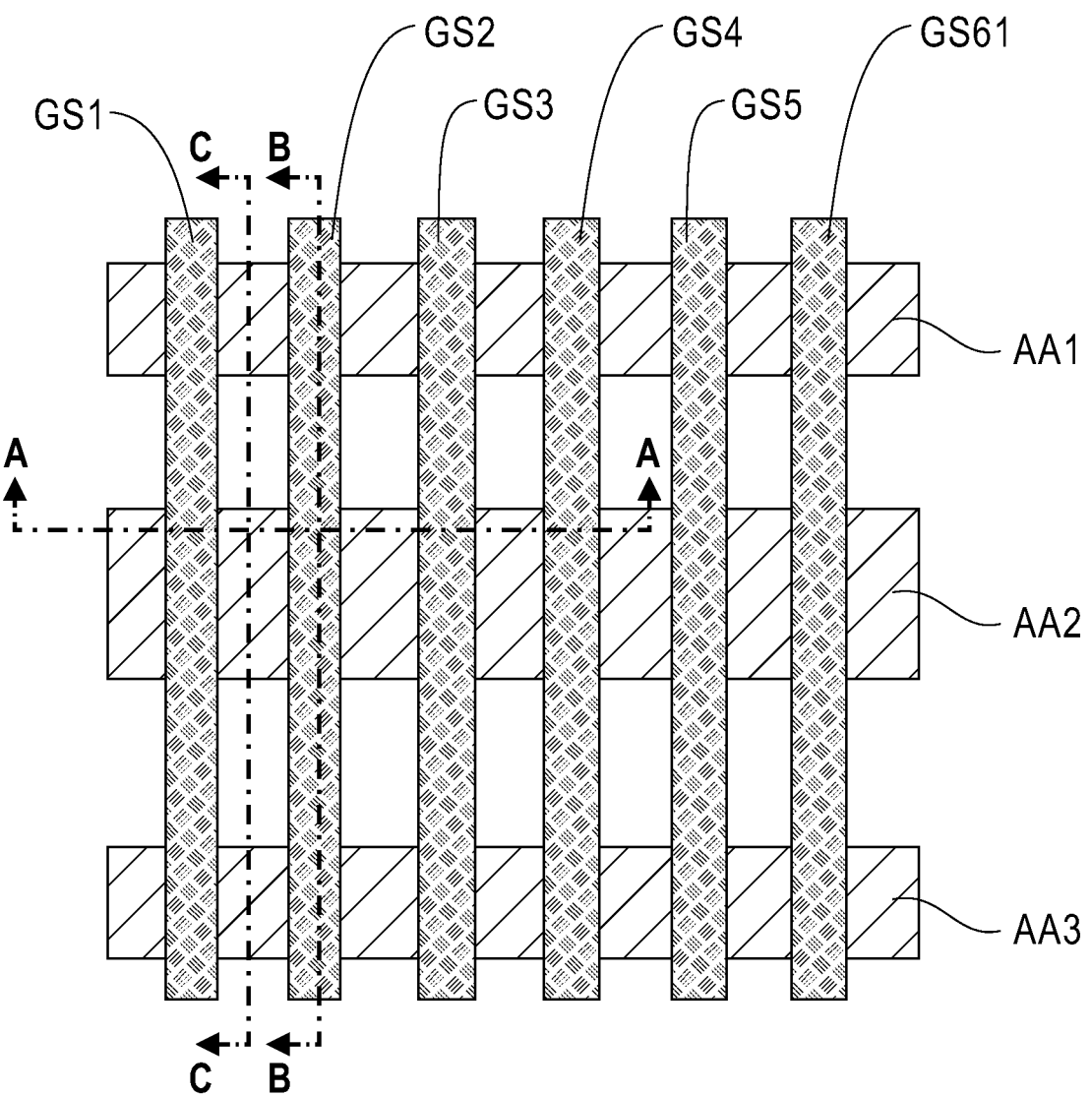
FIG. 1 is a top-down view of an exemplary semiconductor device layout that can be employed in accordance with an embodiment of the present application, the semiconductor device layout includes a plurality of active areas oriented along a first direction, and a plurality of gate structures that are oriented in a second direction which is perpendicular to the first direction; in the drawing cut A-A, cut B-B and cut C-C are shown.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

In dense SRAM cells using nanosheet transistors, the pFET nanosheet transistor side of the cell is similar to the size of the fin. This introduces a lot of unwanted issues such as, for example, inner spacer residual formation, and source/drain epi growth problems. There is a need to avoid providing a SRAM in which the pFET nanosheet transistor side of the cell is similar to the size of the fin.

Referring first to FIG. 1, there is illustrated an exemplary semiconductor device layout (i.e., SRAM device layout) that can be employed in accordance with an embodiment of the present application. The semiconductor device layout includes a plurality of active areas, i.e., first active area AA1, second active area AA2 and third active area AA3, oriented along a first direction, and a plurality of gate structures (e.g., GS1, GS2, GS3, GS4, GS5 and GS6) that are oriented in a second direction which is perpendicular to the first direction. FIG. 1 includes cut A-A, cut B-B and cut C-C. Cut A-A is through the second active area, AA2, and along a lengthwise direction of AA2. Cut B-B is through GS2 and along a length-wise direction of GS2. Cut C-C is in the source/drain region that located between GS1 and GS2 and Cut C-C is in the same direction as B-B.

In the present application, AA1 and AA3 are active areas in which n-type nanosheet transistors are formed. In the SRAM device layout, the n-type nanosheet transistors can be referred to as pull-down and pass-gate transistors. In the present application, AA2, which is positioned between AA1 and AA3, is the active area in which p-type nanosheet transistors are formed. In the SRAM device layout, the p-type nanosheet transistors can be referred to as pull-up transistors.

A pull-up transistor is a type of transistor that is used to provide a high output voltage when its input is at a low voltage. This is used in digital circuits to ensure that a signal is at a logical high state when it is not being actively driven by another circuit. A pull-down transistor is used to provide a low output voltage when its input is at a high voltage. This is also typically used in digital circuits to ensure that the signal is at a logically low state when it is not being actively driven by another circuit. Both pull-up and pull-down transistors are typically used in digital circuits to help to ensure that signals are at a known state when they are not being actively driven by another circuit.

In the present application, a semiconductor structure (e.g., SRAM) is described and illustrated as containing nanosheet transistors. A transistor (or field effect transistor (FET)) includes a source region, a drain region, a semiconductor channel region located between the source region and the drain region, and a gate structure located above the semiconductor channel region. Collectively, the source region and the drain region can be referred to as a source/drain region. A nanosheet transistor is a non-planar transistor that includes a vertical stack of spaced apart semiconductor channel material nanosheets as the semiconductor channel region with a pair of source/drain regions located at each of the ends of the vertical stack of spaced apart semiconductor channel material nanosheets. The gate structure includes a gate dielectric and a gate electrode. The gate structure wraps around a portion of each of the spaced apart semiconductor channel material nanosheets. In some cases, nanosheets transistors are thus referred to as gate-all-around (GAA) transistors.

In the present application, the semiconductor structure (e.g., SRAM) includes a frontside and a backside. The frontside of the semiconductor structure of the present application includes a side of the structure that includes the nanosheet transistors, frontside contact structures, and a frontside BEOL structure. The backside of the semiconductor structure of the present application is the side of the structure that is opposite the frontside. The backside includes a backside contact structure, and a backside interconnect structure.

Figure 2B:
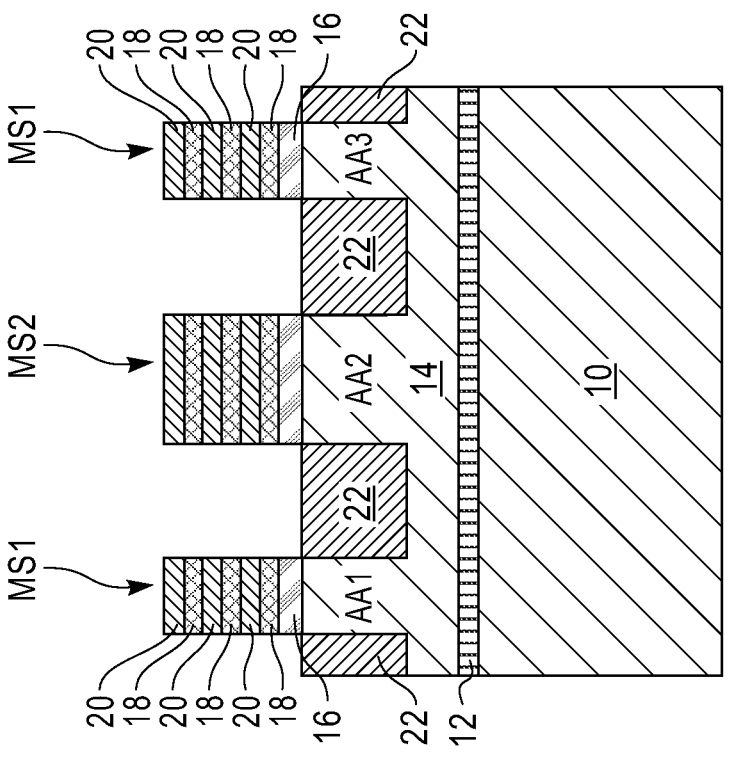
FIGS. 2A and 2B are cross sectional views of an exemplary semiconductor structure corresponding to cuts A-A and B-B shown in FIG. 1, respectively, that can be employed in the present application, the semiconductor structure includes a substrate having a first patterned material stack located in each of a first active area and a third active area, and a second patterned material stack located in a second active area that is located between the first and third active areas, each of the first and second patterned material stacks includes a sacrificial semiconductor base layer, and alternating layers of sacrificial semiconductor material layers and semiconductor channel material layers.
Figure 2A:
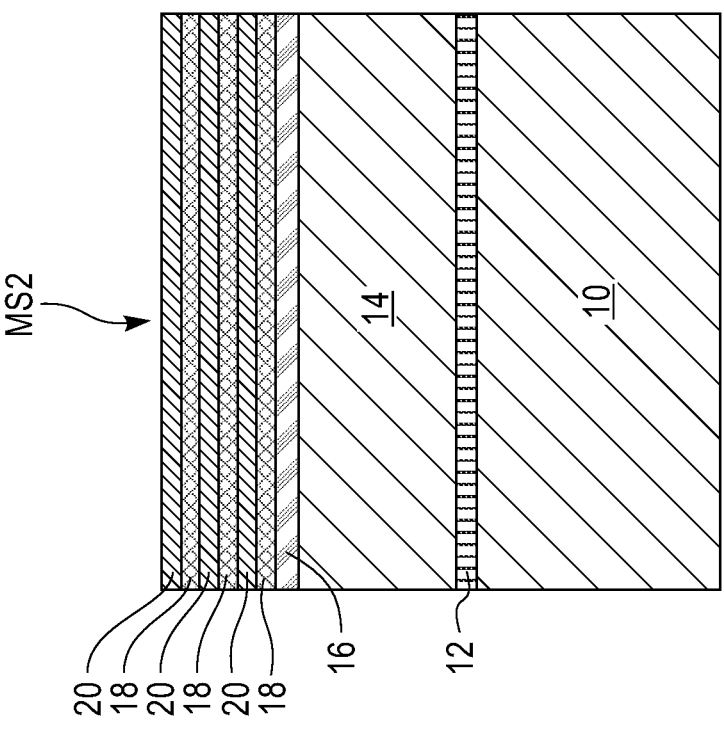

Referring now to FIGS. 2A and 2B, there are illustrated an exemplary semiconductor structure corresponding to cuts A-A and B-B shown in FIG. 1, respectively, that can be employed in the present application. The semiconductor structure includes a substrate having a first patterned material stack MS1 located in each of the first active area AA1 and the third active area AA3, and a second patterned material stack MS2 located in the second active area AA2 that is located between the first active area AA1 and the third active area AA3. The substrate can include a first semiconductor layer 10, an etch stop layer 12 and a second semiconductor layer 14. Although the present application describes and illustrates the substrate as containing the first semiconductor layer 10, the etch stop layer 12 and the second semiconductor layer 14, the substrate is not limited to one that includes each of those layers. Embodiments include a substrate including only the first semiconductor layer 10, or including the first semiconductor layer 10 and the etch stop layer 12, or including the first semiconductor layer 10 and the second semiconductor layer 14 without an etch stop layer 12 being present between those two semiconductor layers.

Each of the first and second patterned material stacks MS1 and MS2 includes a sacrificial semiconductor base layer 16, and alternating layers of sacrificial semiconductor material layers 18 and semiconductor channel material layers 20. In the present application, and as is illustrated in FIG. 2B, the length of the MS1 is greater than a length of MS2.

The various active areas are separated by a shallow trench isolation structure 22. The shallow trench isolation structure 22 is located in an upper portion of the substrate. In the illustrated embodiment, the shallow trench isolation structure 22 is embedded in the second semiconductor layer 14 of the substrate. In the illustrated embodiment, the shallow trench isolation structure 22 has a first surface that contacts a sub-surface of the second semiconductor layer 14 and a second surface, opposite the first surface that is substantially coplanar with a topmost surface of the second semiconductor layer 14. In the present application, the term "sub-surface" denotes a surface of a material layer/structure that is located between a topmost surface and a bottommost surface of that material layer/structure. In the present application, the term "substantially coplanar" denotes that a material layer/structure has a surface that is either coplanar with, or offset ($\pm$10%) from, a surface of another material layer/structure.

Each of the various elements illustrated in FIGS. 2A-2B will now be described in greater detail. The first semiconductor layer 10 is composed of a first semiconductor material, and the second semiconductor layer 14 is composed of a second semiconductor material. The term "semiconductor material" is used throughout the present application to denote a material having semiconducting properties. Examples of semiconductor materials that can be used in the present application in providing the first semiconductor material and the second semiconductor material include, but are not limited to, silicon (Si), a silicon germanium (SiGe) alloy, a silicon germanium carbide (SiGeC) alloy, germanium (Ge), III/V compound semiconductors or II/VI compound semiconductors. The second semiconductor material that provides the second semiconductor layer 14 can be compositionally the same as, or compositionally different from, the first semiconductor material that provides the first semiconductor layer 10.

In some embodiments of the present application, the etch stop layer 12 can be composed of a dielectric material such as, for example, silicon dioxide and/or boron nitride. In other embodiments of the present application, the etch stop layer 12 is composed of a semiconductor material that is compositionally different from the first semiconductor material that provides the first semiconductor layer 10 and the second semiconductor material that provides the second semiconductor layer 14. In one example, the first semiconductor layer 10 is composed of silicon, the etch stop layer 12 is composed of silicon dioxide, and the second semiconductor layer 14 is composed of silicon. In another example, the first semiconductor layer 10 is composed of silicon, the etch stop layer 12 is composed of silicon germanium, and the second semiconductor layer 14 is composed of silicon.

The substrate including the first semiconductor layer 10, the etch stop layer 12 and the second semiconductor layer 14 can be formed utilizing techniques well known to those skilled in the art. For example, the substrate including the first semiconductor layer 10, the etch stop layer 12 and the second semiconductor layer 14 can be formed by a separation by ion implantation of oxygen process, or wafer bonding. Alternatively, the substrate including the first semiconductor layer 10, the etch stop layer 12 and the second semiconductor layer 14 can be formed by deposition of the various substrate layers one on top the other. The deposition used in forming the various substrate layers can include, but is not limited to, chemical vapor deposition (CVD), plasma enhanced chemical vapor deposition (PECVD), or epitaxial growth. The terms "epitaxial growth" or "epitaxially growing" means the growth of a semiconductor material on a growth surface of another semiconductor material, in which the semiconductor material being grown has the same crystalline characteristics as the growth surface of the another semiconductor material. In an epitaxial deposition process, the chemical reactants provided by the source gases are controlled and the system parameters are set so that the depositing atoms arrive at the growth surface of the another semiconductor material with sufficient energy to move around on the growth surface and orient themselves to the crystal arrangement of the atoms of the growth surface. Examples of various epitaxial growth process apparatuses that can be employed in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from 550° C. to 900° C. Although higher temperature typically results in faster deposition, the faster deposition may result in crystal defects and film cracking.

The semiconductor base layer 16 is composed of a third semiconductor material, the sacrificial semiconductor material layers 18 are composed of a fourth semiconductor material and the semiconductor channel material layers 20 are composed of a fifth semiconductor material. In the present application, the third semiconductor material is compositionally different from either of the second semiconductor material, the fourth semiconductor material and the fifth semiconductor material. The third semiconductor material, the fourth semiconductor material and the fifth semiconductor material include one of the semiconductor materials mentioned above for the first semiconductor layer 10. In one example, the third semiconductor material that provides the semiconductor base layer 16 is composed of a silicon germanium alloy having a germanium content from 55 atomic percent to 75 atomic percent, the fourth semiconductor material that provides each sacrificial semiconductor material layer 18 is composed of a silicon germanium alloy having a germanium content from 20 atomic percent to 40 atomic percent, and the fifth semiconductor material that provides each semiconductor channel material layer 20 is composed of silicon.

In some embodiments and as is illustrated in FIGS. 2A-2B, there is an equal number of sacrificial semiconductor material layers 18 and semiconductor channel material layers 20 in each of the first and second patterned material stacks MS1 and MS2. That is, each of the first and second patterned material stacks MS1 and MS2 can include 'n' number of semiconductor channel material layers 20 and 'n' number of sacrificial semiconductor material layers 18, wherein n is an integer starting from one; typically n is greater than one. By way of one example, each of the first patterned material stacks MS1 and the second patterned material stack MS2 includes three sacrificial semiconductor material layers 18 and three semiconductor channel material layers 20.

The shallow trench isolation structure 22 is composed of any trench dielectric material such as, for example, silicon oxide. In some embodiments, a trench dielectric liner composed of, for example, SiN, can be present along a sidewall and a bottom wall of the trench dielectric material.

The first and second patterned material stacks MS1 and MS2 can be formed by first forming a blanket layer of the third semiconductor material on a topmost surface of the substrate, e.g., on a topmost surface of the second semiconductor layer 14. The blanket layer of the third semiconductor material can be formed by a deposition process such as, for example, CVD, PECVD or epitaxial growth. After forming the blanket layer of the third semiconductor material alternating blanket layers of the fourth semiconductor material and the fifth semiconductor material are formed on the blanket layer of third semiconductor material. Each blanket layer of the fourth semiconductor material and each blanket layer of the fifth semiconductor material can be formed by a deposition process such as, for example, CVD, PECVD or epitaxial growth. After forming the alternating blanket layers of the fourth semiconductor material and the fifth semiconductor material, the blanket layers of third semiconductor material, fourth semiconductor material and fifth semiconductor can be patterned by lithography and etching to provide first patterned material stacks MS1 and the second patterned material stacks MS2. A single patterning process or two separate patterning processes can be used forming MS1 and MS2. It is noted that the method of the present application does not require a fin like structure for the second patterned material stack MS2.

Following the formation of the first and second patterned material stacks MS1 and MS2, the shallow trench isolation structure 22 can be formed by forming a trench into the substrate (by lithography and etching), filling the trench with the optional trench dielectric liner material and the trench dielectric material, and thereafter performing an etch back process.

Figure 3A:
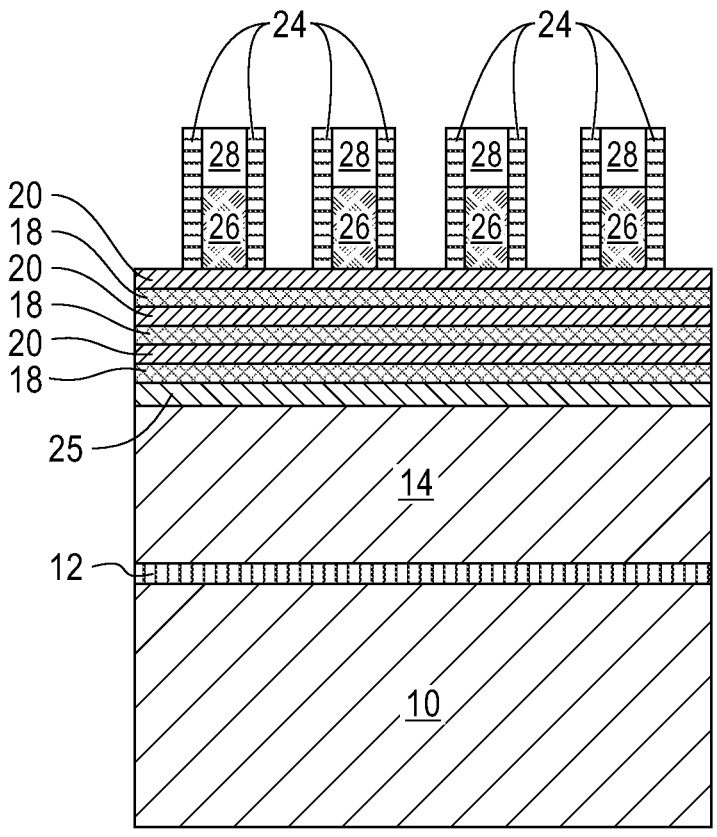
FIGS. 3A-3B are cross sectional views of the exemplary semiconductor structure shown in FIGS. 2A-2B, respectively, after forming sacrificial gate structures, removing the sacrificial semiconductor base layer from each of the first and second patterned material stacks and forming a bottom dielectric isolation layer and dielectric spacers.
Figure 3C:
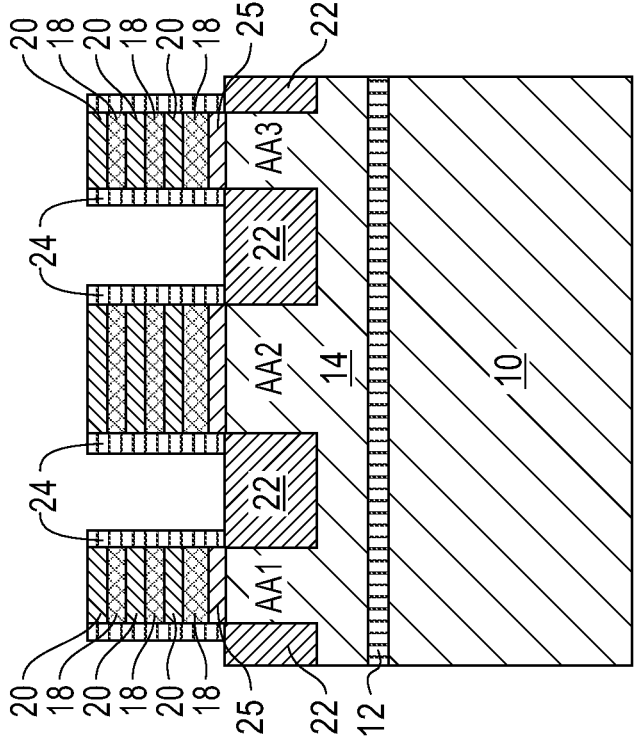
FIG. 3C is a cross sectional view of the exemplary semiconductor structure shown in FIGS. 3A-3B through cut C-C shown in FIG. 1.
Figure 3B:
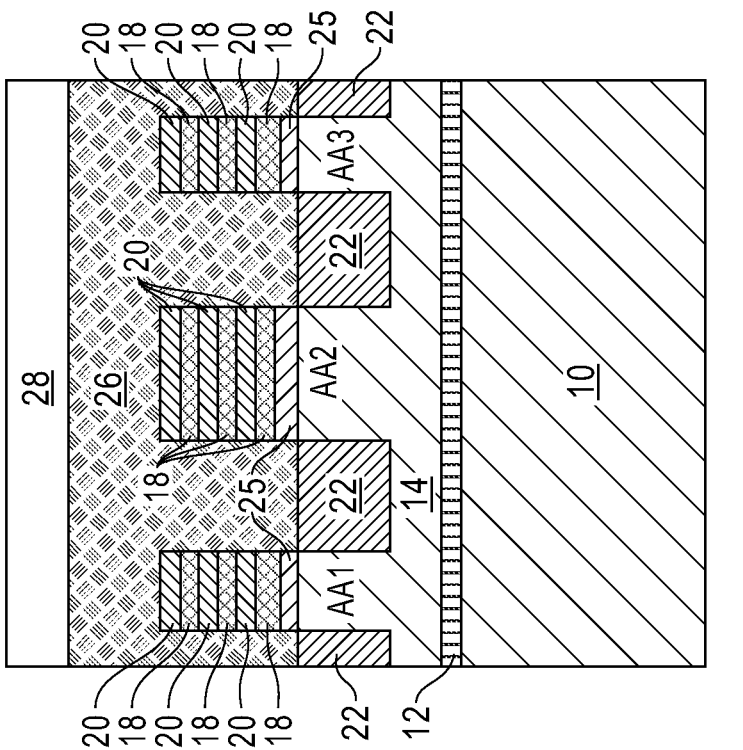

Referring now to FIGS. 3A-3B, there are illustrated the exemplary semiconductor structure shown in FIGS. 2A-2B, respectively, after forming sacrificial gate structures 26, removing the sacrificial semiconductor base layer 16 from each of the first and second patterned material stacks MS1 and MS2 and forming a bottom dielectric isolation layer 25 and dielectric spacers 24. In embodiments, each sacrificial gate structure 26 can include a sacrificial gate cap 28 located thereon. FIG. 3C shows the exemplary semiconductor structure of FIGS. 3A-3B through cut C-C shown in FIG. 1.

Each sacrificial gate structure 26 includes at least a sacrificial gate material. In some embodiments, each sacrificial gate structure 26 can also include a sacrificial gate dielectric material. In such embodiments, the sacrificial gate dielectric material would be located beneath the sacrificial gate material. The optional sacrificial gate dielectric material can be composed of a dielectric material such as, for example, silicon dioxide. The sacrificial gate material can be composed of, for example, polysilicon, amorphous silicon, amorphous silicon germanium or amorphous germanium. Each sacrificial gate cap 28 is composed of a hard mask material such as, for example, silicon nitride or silicon oxynitride. In the present application, each sacrificial gate structure 26 containing the sacrificial gate cap 28 can be formed depositing a blanket layer of optional sacrificial gate dielectric material (if the same is present), a blanket layer of the sacrificial gate material, and a blanket layer of the hard mask material (if the sacrificial gate cap 28 is present). Deposition can include, for example, CVD, PECVD, or physical vapor deposition (PVD). These blanket deposition layers are then patterned by lithography and etching to provide sacrificial gate structure 26 that are optionally capped with sacrificial gate cap 28. In the present application, the sacrificial gate structures 26 straddle over a portion of each of the first and second patterned material stacks MS1 and MS2. By "straddles over" it is meant that the a material layer/structure is present on top of and along two opposing sidewalls of another material layer/structure.

After sacrificial gate structure 26 formation, the sacrificial semiconductor base layer 16 is removed from each of the first and second patterned material stacks MS1 and MS2 utilizing each sacrificial gate structure 26 as an anchoring element. The removal of the sacrificial semiconductor base layer 16 includes an etch that is selective in removing the third semiconductor material that provides the sacrificial semiconductor base layer 16. After removal of the sacrificial semiconductor base layer 16, a cavity (not shown) is formed beneath each of the first and second patterned material stacks MS1 and MS2. The bottom dielectric isolation layer 25 and the dielectric spacer 24 are formed simultaneously by deposition, followed by a spacer etch process. The deposition can include, for example, CVD, PEVCD, or PVD. The deposition fills each cavity with a dielectric spacer material, and the same dielectric spacer material is formed along sidewalls of each of the first and second patterned material stacks MS1 and MS2. The dielectric spacer material that provides both the bottom dielectric isolation layer 25 and the dielectric spacer 24 includes, but is not limited to, silicon dioxide, SiN, SiBCN, SiOCN or SiOC.

Figure 4A:
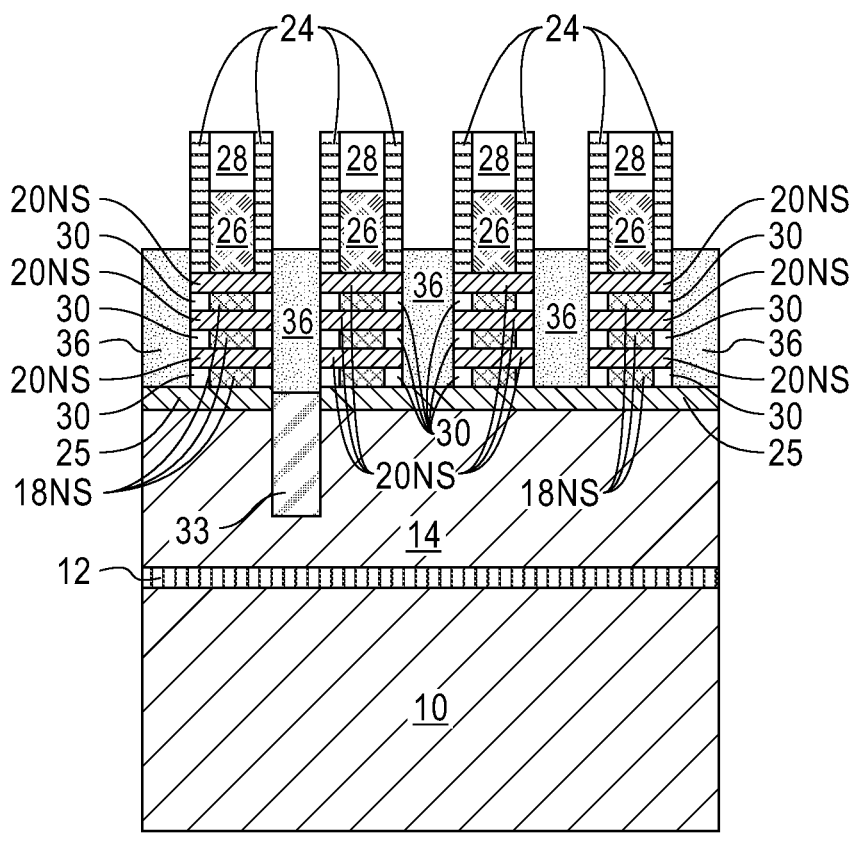
FIGS. 4A-4C are cross sectional views of the exemplary semiconductor structure shown in FIGS. 3A-3C, respectively, after nanosheet formation, inner dielectric spacer formation, formation of backside source/drain contact placeholder structures, and source/drain regions including n-doped source/drain regions and p-doped source/drain regions.
Figure 4C:
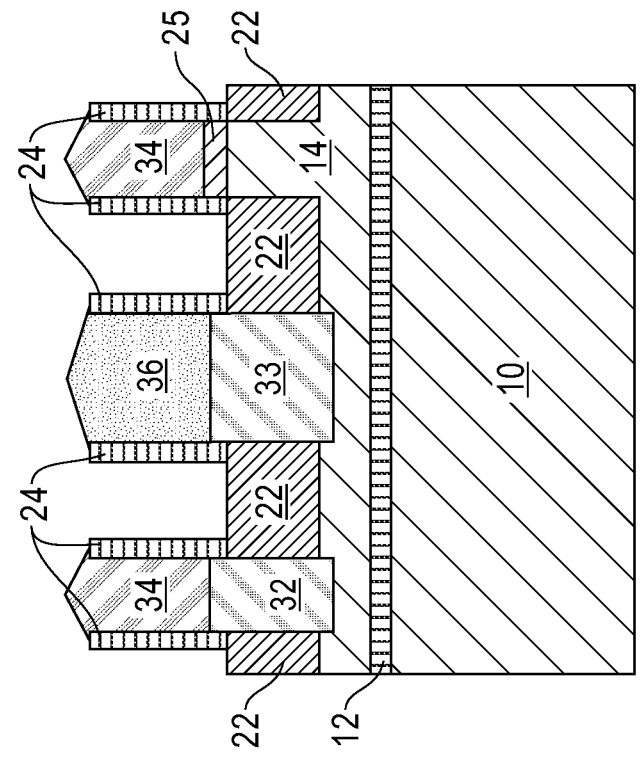
Figure 4B:
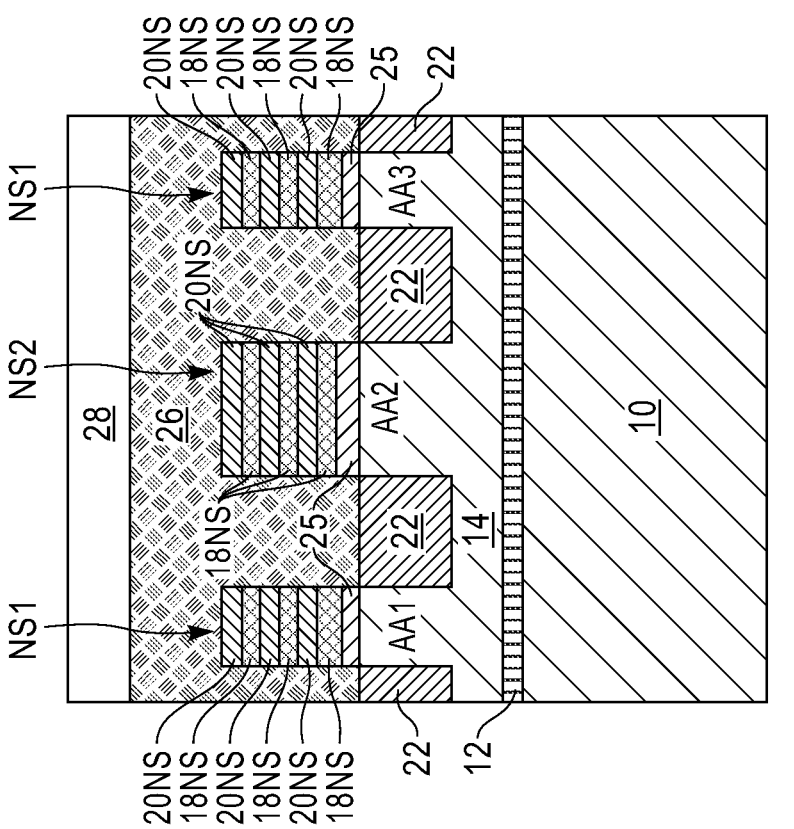

Referring now to FIGS. 4A-4C, there are illustrated the exemplary semiconductor structure shown in FIGS. 3A-3C, respectively, after nanosheet formation, inner dielectric spacer 30 formation, formation of backside source/drain contact placeholder structures 32, 33 and source/drain regions including n-doped source/drain regions 34 and p-doped source/drain regions 36.

Nanosheet formation includes etching the first and second patterned material stacks MS1 and MS2 utilizing at least each sacrificial gate structure 26 and the dielectric spacer 24 that is present along the sidewalls of the sacrificial gate structures 26 as a combined etch mask. This etch stops on a surface of the bottom dielectric isolation layer 25 and removes portions of each semiconductor channel material layer 20 and each sacrificial semiconductor material layer 18 that are not protected by the combined etch mask. This etch creates first nanosheet stacks NS1 in the first and third active areas AA1 and AA3, and a second nanosheet stack NS2 in the second active area. Each first nanosheet stack NS1 includes remaining, i.e., non-etched, portions of the alternating sacrificial semiconductor material layers 18 and semiconductor channel material layers 20 of the first patterned material stack MS1, while the second nanosheet stack NS2 includes remaining, i.e., non-etched, portions of the alternating sacrificial semiconductor material layers 18 and semiconductor channel material layers 20 of the second patterned material stack MS2.

Within each of the first and second nanosheet stacks NS1 and NS2 the remaining, i.e., non-etched, portions of the sacrificial semiconductor material layers 18 can be referred to as a sacrificial semiconductor material nanosheet 18NS, and the remaining, i.e., non-etched, portions of the semiconductor channel material layers 20 can be referred to as a semiconductor channel material nanosheet 20NS. At this point of the present application, and as is illustrated in FIG. 4B, each first nanosheet stack NS1 has a length that is less than a length of the second nanosheet stack NS2.

After forming the first and second nanosheet stacks NS1 and NS2, the inner dielectric spacer 30 is formed. The inner dielectric spacer 30 formation includes recesses each of the sacrificial semiconductor material nanosheets 18NS of the first and second nanosheet stacks NS1 and NS2. This recess is a lateral etch that removes end portions of the sacrificial semiconductor material nanosheets 18NS. The lateral etch is selective in removing the fourth semiconductor material that provides the sacrificial semiconductor material nanosheets 18NS. Within each of the first and second nanosheet stacks the recessed sacrificial semiconductor material nanosheets 18NS have a length that is less than a length of the semiconductor channel material nanosheets 20NS (the semiconductor channel material nanosheets 20NS are not recessed by this lateral etch). A gap is formed at the end of each of the recessed sacrificial semiconductor material nanosheets 18NS. One of the above spacer dielectric materials is then formed within each of the gaps to provide the inner spacers 30. The spacer dielectric material is formed by deposition (e.g., CVD, PECVD or atomic layer deposition (ALD)), followed by an isotropic etch process. The inner spacers 30 will serves as support pillars during the subsequent removal of the sacrificial semiconductor material nanosheets 18NS and will aid in suspending the semiconductor channel material nanosheets 20NS. Notably, instead of forming two individual pFET Fins with small Fin width, here a merged large pFET Fin is formed (MS2). This would be beneficial for inner spacer formation because the gap between the dielectric spacer 24 (as shown in FIG. 4C) is larger for pFETs, which avoids pinch-off issue during inner spacer liner deposition.

After inner spacer 30 formation, the backside source/drain contact placeholder structures 32, 33 are formed by etching backside source/drain contact placeholder structure trenches into an upper portion of the substrate; it is noted that this etch punches through (and thus opens) the bottom dielectric isolation layer 25. In the illustrated embodiments, the backside source/drain contact placeholder structure trenches are formed into an upper portion of the second semiconductor layer 14. Each of the backside source/drain contact placeholder structure trenches physically exposes a sub-surface of the substrate. In the illustrated embodiments, the backside source/drain contact placeholder structure trenches physically expose a sub-surface of the second semiconductor layer 14. Each of the backside source/drain contact placeholder structure trenches is then filled with a placeholder material. In one embodiment, the placeholder material is composed of a sixth semiconductor material. In one example, the sixth semiconductor material is composed of a silicon germanium alloy. The backside source/drain contact placeholder structures 32, 33 can be formed by deposition (e.g., CVD, PECVD or epitaxial growth) of the sixth semiconductor material, followed by a recess etch. In the present application, the backside source/drain contact placeholder structures 33 have a width that is wider than a width of the backside source/drain contact placeholder structures 32. Notably, the backside source/drain contact placeholder structures 33 are formed into wider width backside source/drain contact placeholder structure trenches than conventional SRAM design where two small pFET Fins are formed in the beginning. The wider width trenches reduce and, in some cases, eliminates the issue of inner spacer residual as mentioned in previous discussion. Also, wider trenches are for easy backside source/drain contact placeholder structure formation.

After forming the backside source/drain contact placeholder structures 32, 33, the source/drain regions are formed. Namely, n-doped source/drain regions 34 and p-doped source/drain regions 36 are formed as is shown in FIG. 4C. Each n-doped source/drain region 34 and each p-doped source/drain regions 36 is confined between a pair of spaced apart dielectric spacers 24.

The n-doped source/drain regions 34 are composed of a seventh semiconductor material and an n-type dopant, while the p-doped source/drain regions 36 are composed of an eighth semiconductor material and a p-type dopant. As used herein, a "source/drain" region can be a source region or a drain region depending on subsequent wiring and application of voltages during operation of the transistor. The seventh and eighth semiconductor materials can be compositionally the same, or compositionally different from, the fifth semiconductor material that provides each semiconductor channel material nanosheet 20NS. The seventh semiconductor material can be compositionally the same, or compositionally different from, the eighth semiconductor material. The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium, phosphorus and indium. "N-type" refers to the addition of impurities that contributes free electrons to an intrinsic semiconductor. In a silicon containing semiconductor material, examples of n-type dopants, i.e., impurities, include, but are not limited to, antimony, arsenic and phosphorous. In one example, each source/drain region can have a dopant concentration of from $4 \times 10^{20}$ atoms/cm$^3$ to $3 \times 10^{21}$ atoms/cm$^3$. The source/drain regions are typically formed by an epitaxial growth process, as defined above. A recess etch can follow the epitaxial growth process.

At this point of the present application, some of the p-doped source/drain region 36 are located on one of the backside source/drain contact placeholder structures 33, while other p-doped source/drain region 36 are located on the bottom dielectric isolation layer 25. At this point of the present application, some of the n-doped source/drain region 34 are located on one of the backside source/drain contact placeholder structures 32, while other n-doped source/drain region 34 are located on the bottom dielectric isolation layer 25.

Figure 5A:
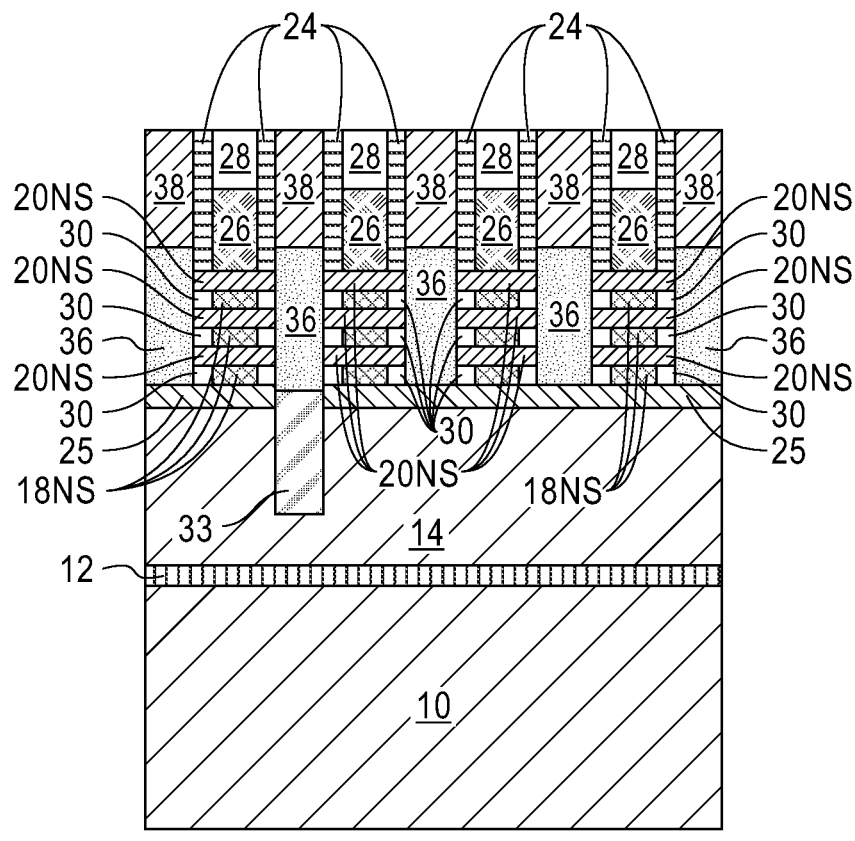
FIGS. 5A-5C are cross sectional views of the exemplary semiconductor structure shown in FIGS. 4A-4C, respectively, after forming a first frontside interlayer dielectric (ILD) layer.
Figure 5C:
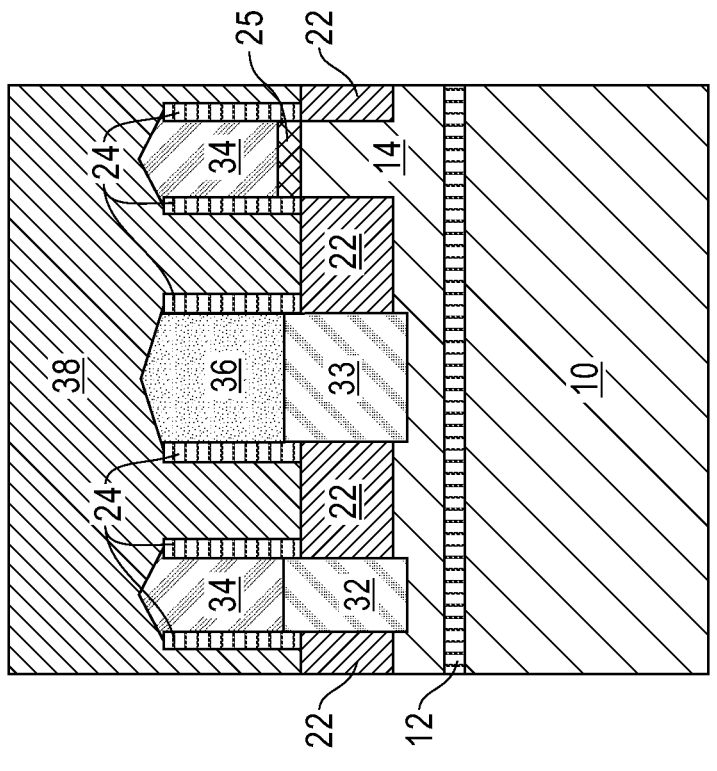
Figure 5B:
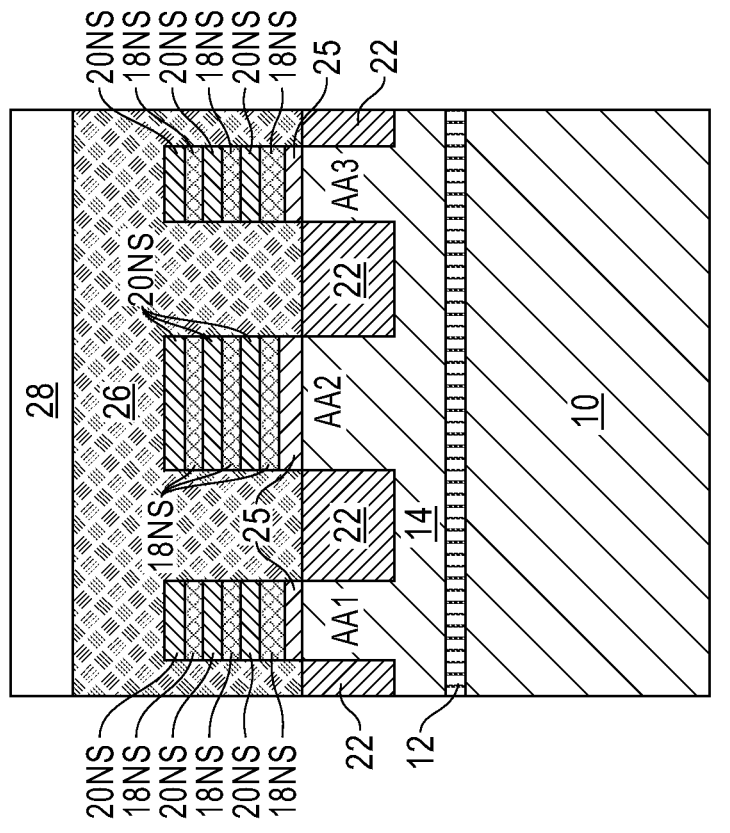

Referring now to FIGS. 5A-5C, there are illustrated the exemplary semiconductor structure shown in FIGS. 4A-4C, respectively, after forming a first frontside ILD layer 38. The first frontside ILD layer 38 is formed on top of as well as adjacent to the n-doped source/drain region 34 and the p-doped source/drain region 36 and adjacent to each sacrificial gate structure 26. The first frontside ILD layer 38 is composed of a dielectric material including, for example, silicon oxide, silicon nitride, undoped silicate glass (USG), fluorosilicate glass (FSG), borophosphosilicate glass (BPSG), a spin-on low-k dielectric layer, a chemical vapor deposition (CVD) low-k dielectric layer, or any combination thereof. The term "low-k" as used throughout the present application denotes a dielectric material that has a dielectric constant of less than 4.0 (all dielectric constants mentioned herein are relative to a vacuum unless otherwise noted). The first frontside ILD layer 38 can be formed by a deposition process including, but not limited to, CVD, PECVD or spin-on coating. A planarization process such as, for example, chemical mechanical polishing (CMP) follows the deposition process. The planarization process can remove an upper portion of the dielectric spacer 24, and if present, an upper portion of the sacrificial gate cap 28.

Figure 6A:
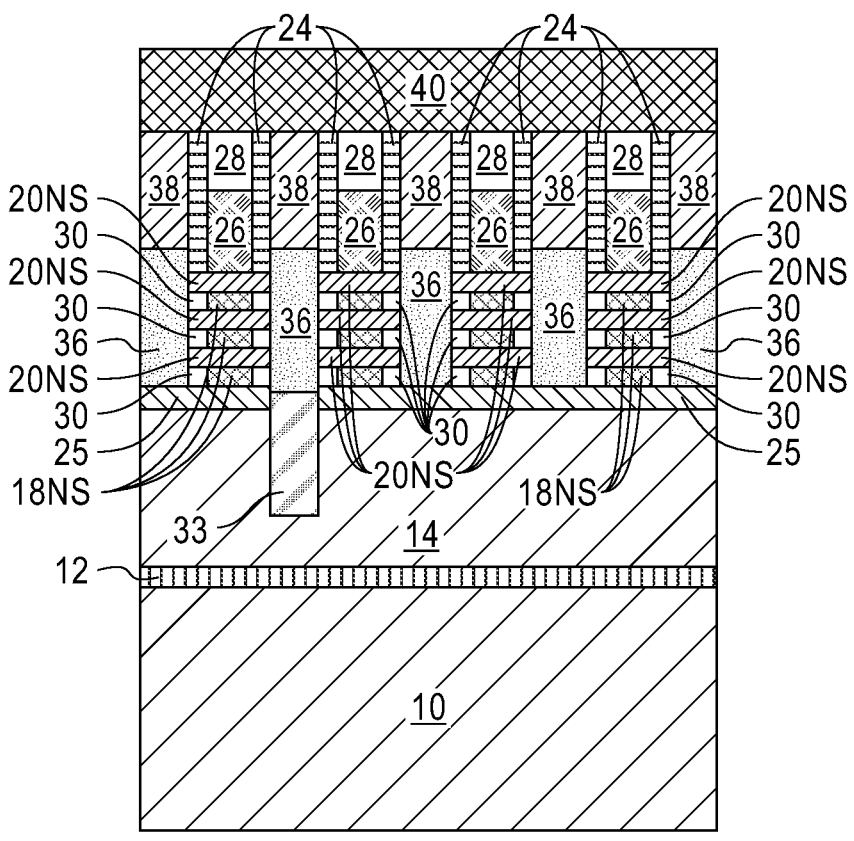
FIGS. 6A-6C are cross sectional views of the exemplary semiconductor structure shown in FIGS. 5A-5C, respectively, after forming a patterned organic planarization layer (OPL) having an opening formed therein.
Figure 6C:
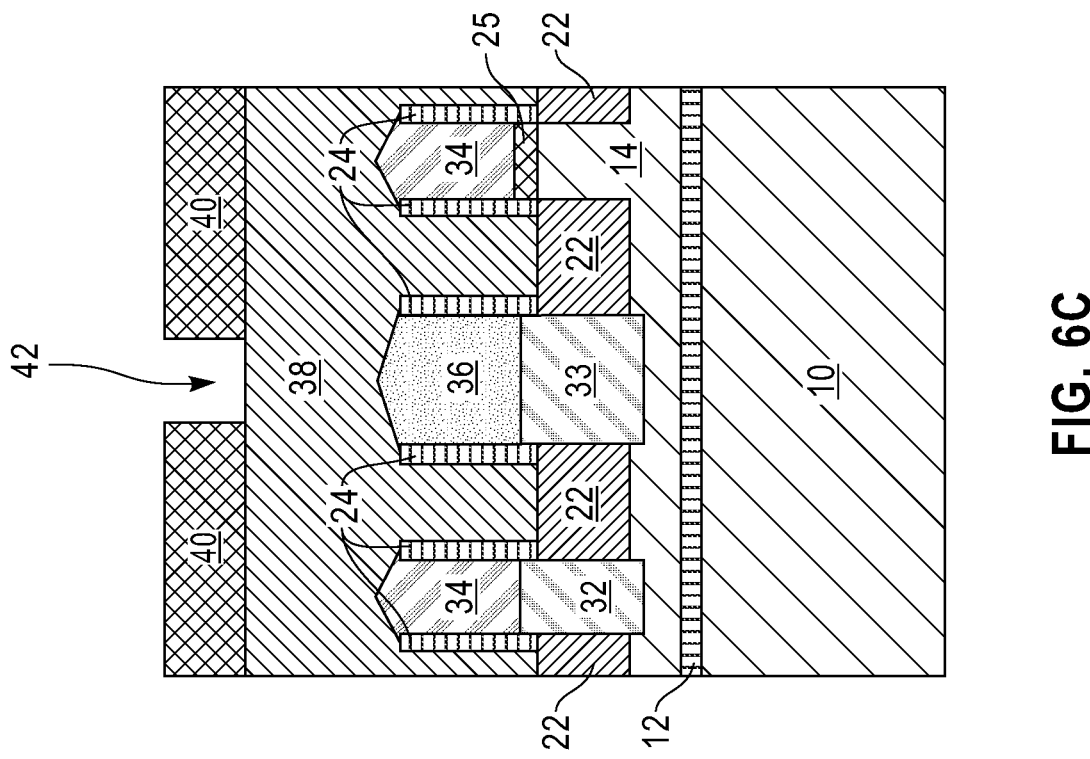
Figure 6B:
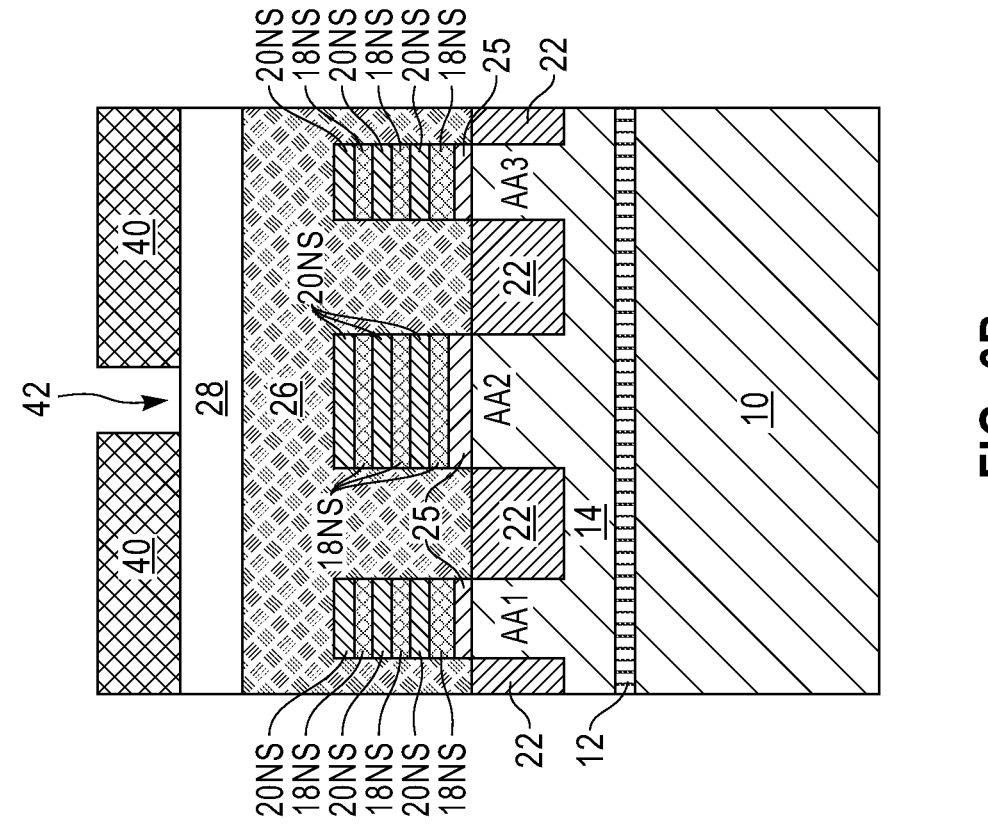

Referring now to FIGS. 6A-6C, there is illustrated the exemplary semiconductor structure shown in FIGS. 5A-5C, respectively, after forming a patterned OPL 40 having an opening 42 formed therein. The patterned OPL 40 having opening 42 can be formed by first depositing an organic planarization material layer on the surface of the exemplary structure shown in FIGS. 5A-5C. The deposition can include CVD, PECVD, or spin-on coating. After depositing the organic planarization material layer, lithography and etching can be used to form the opening 42. Opening 42 is formed in the second device area AA2 in which the pull-up transistor (i.e., pFET) will be subsequently formed.

Figures 7A, 7B:
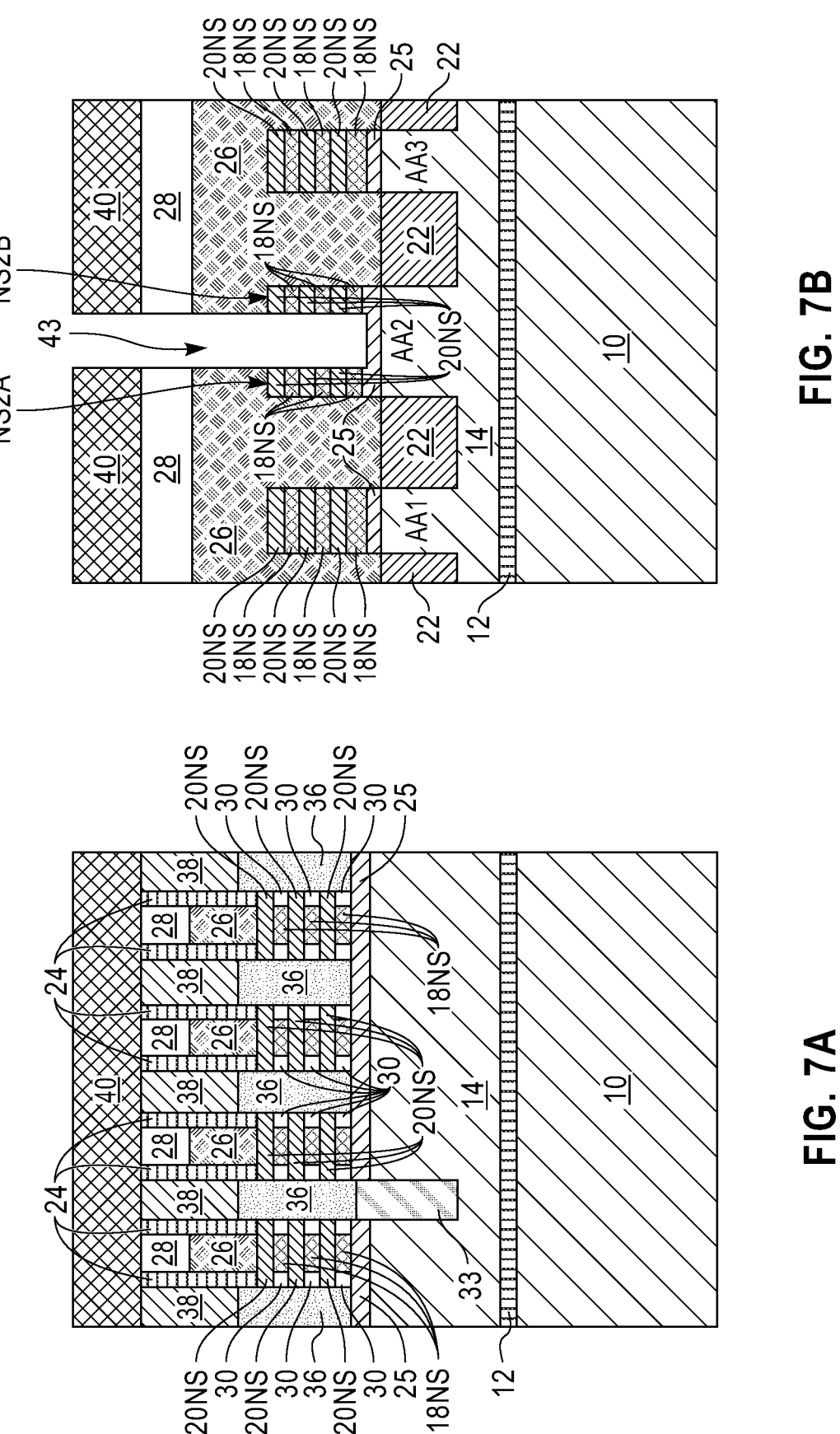
FIGS. 7A-7C are cross sectional views of the exemplary semiconductor structure shown in FIGS. 6A-6C, respectively, after cutting the sacrificial gate structure and the nanosheet stack in the second active area to provide a pair of reduced channel length nanosheet stacks in the second active area, the pair of reduced channel length nanosheet stacks in the second active area being separated by a cut region.
Figures 7C, 7D:
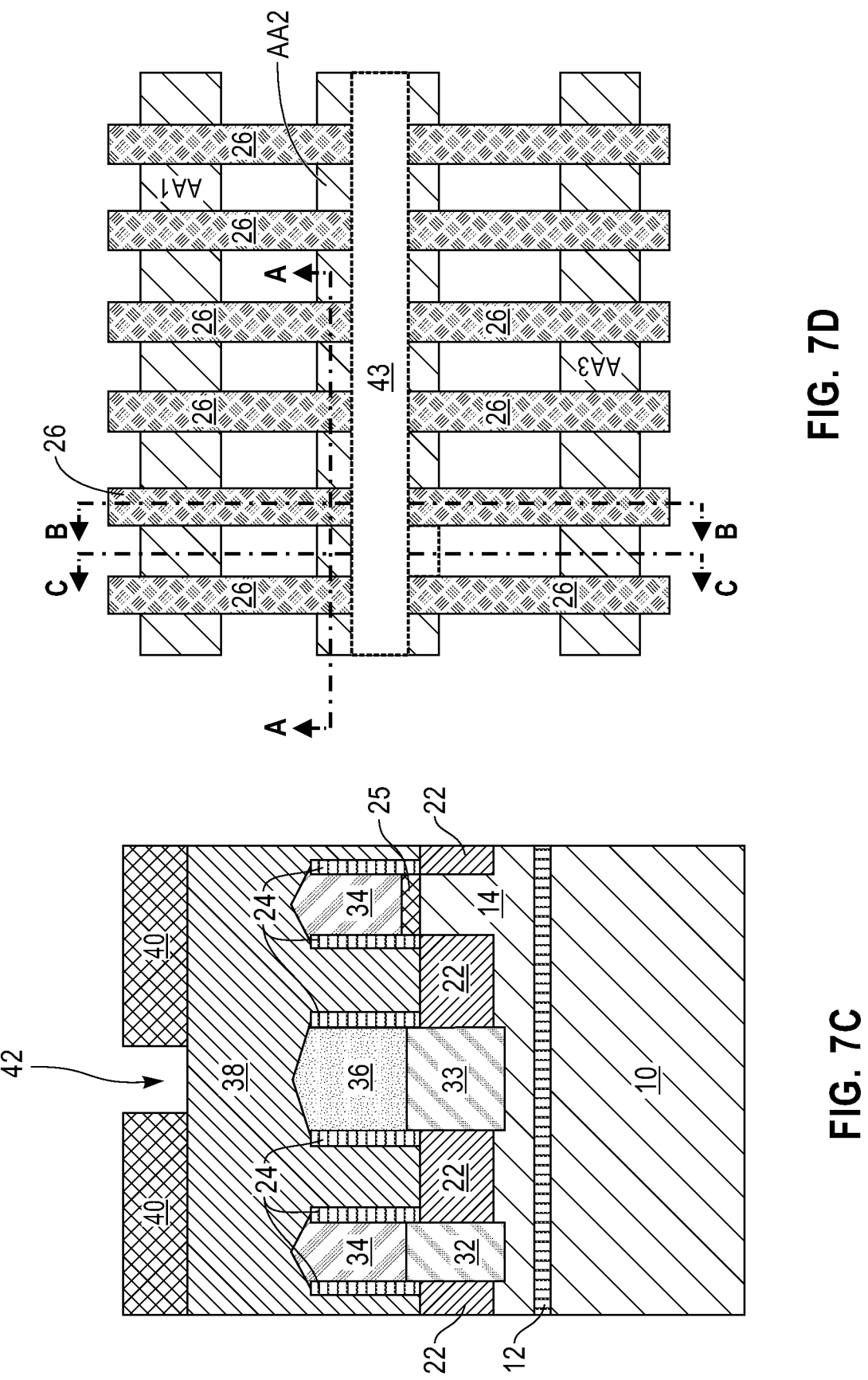
FIG. 7D is a top-down view of the exemplary semiconductor structure shown in FIGS. 7A-7C; some elements shown in the cross sectional views have been omitted for clarity.

Referring now to FIGS. 7A-7C, there are illustrated the exemplary semiconductor structure shown in FIGS. 6A-6C, respectively, after cutting the sacrificial gate structure 26 and the nanosheet stack (i.e., the second nanosheet stacks NS2) in the second active area AA2 to provide a pair of reduced channel length nanosheet stacks (i.e., reduced channel length second nanosheet stacks NS2A and NS2B) in the second active area AA2, the pair of reduced channel length nanosheet stacks (i.e., NS2A and NS2B) in the second active area AA2 being separated by a cut region 43. FIG. 7D is a top-down view of the exemplary semiconductor structure shown in FIGS. 7A-7C. This gate cut step is performed by a gate cut etch that removes physically exposed portions of the sacrificial gate cap 28 (if the same is present), the sacrificial gate structure 26 and the second nanosheet stack NS2. This gate cut step stops on a surface of the bottom dielectric isolation layer 25 that is present beneath the second nanosheet stack NS2. This gate cut etch can stop on the topmost surface of the bottom dielectric isolation layer 25 or it can stop on a subs-surface of the bottom dielectric isolation layer 25. This cut gate etch provides reduced channel length second nanosheet stacks NS2A and NS2B (See, FIG. 7B) that include remaining portions of the sacrificial semiconductor channel material nanosheets 18NS and remaining portions of the semiconductor channel material nanosheets. After the gate cut step is performed, the patterned OPL 40 can be removed from the structure utilizing a material removal process such as, for example, CMP or etching.

Figure 8A:
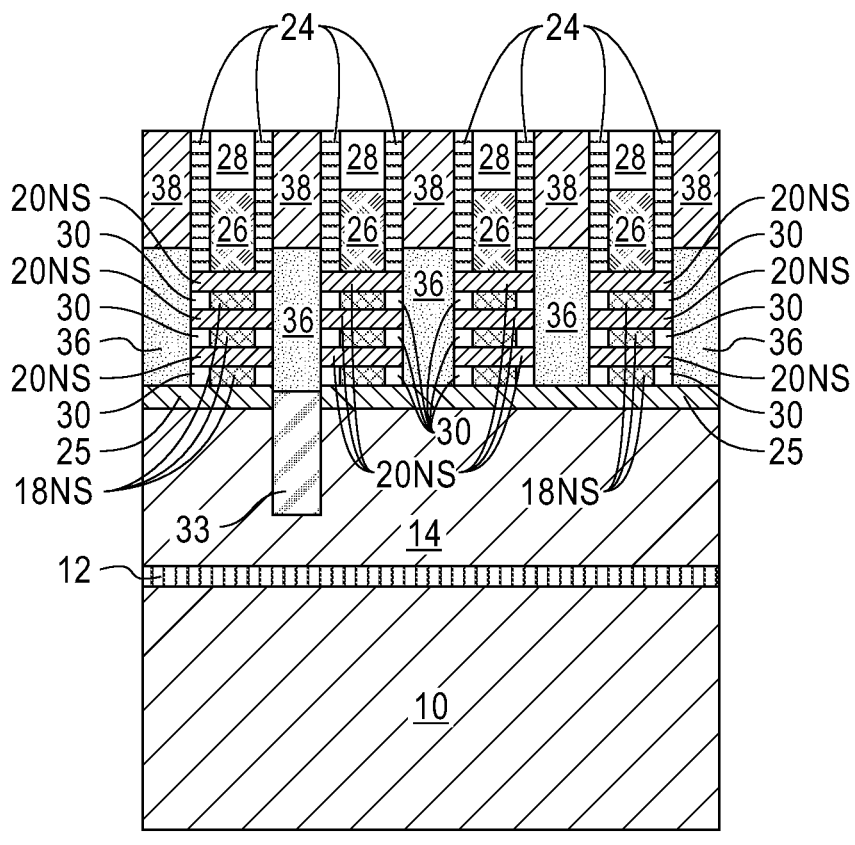
FIGS. 8A-8C are cross sectional views of the exemplary semiconductor structure shown in FIGS. 7A-7C, respectively, after forming a sacrificial pillar structure in the cut region.
Figures 8B, 8C:
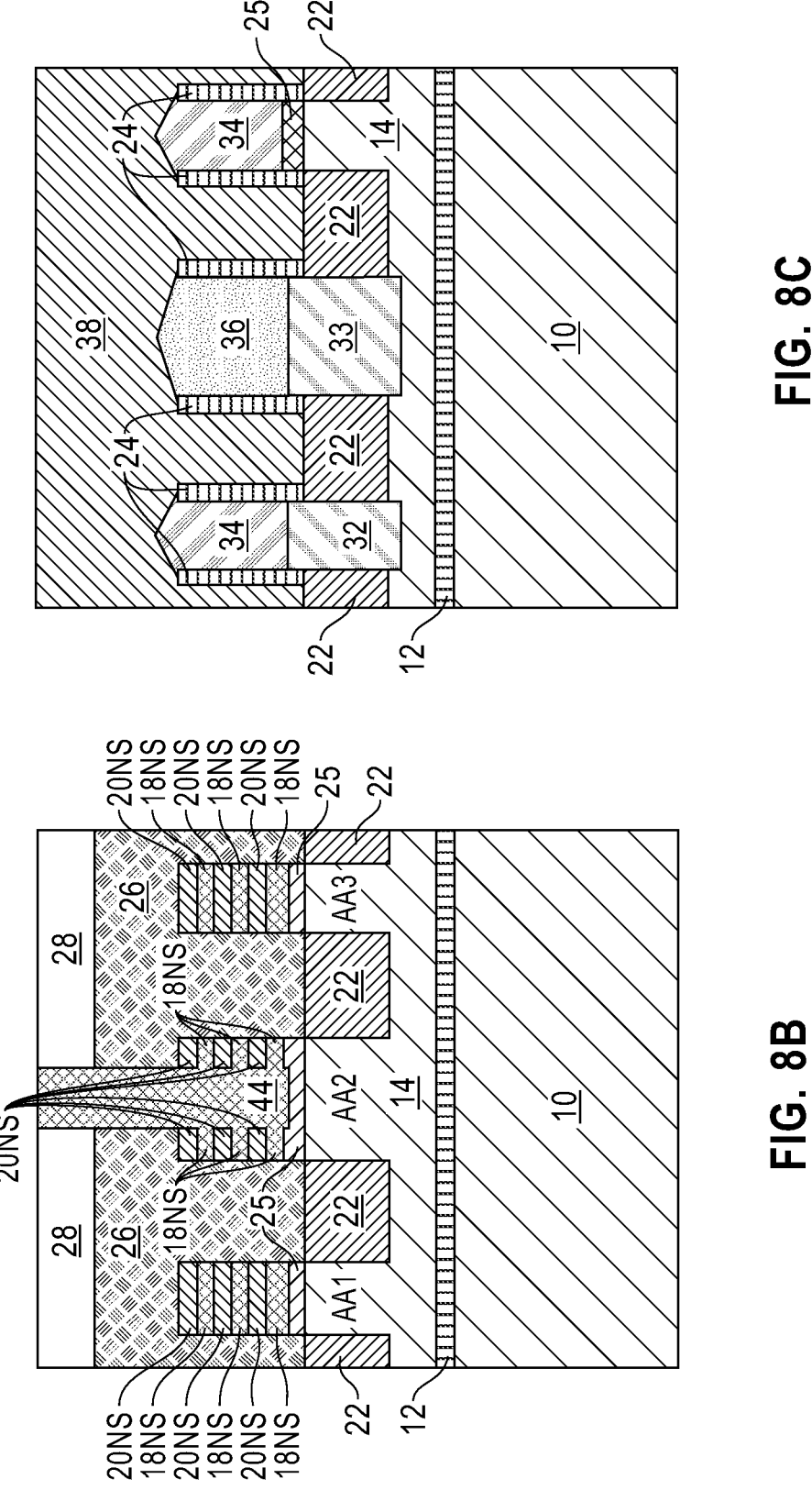

Referring now to FIGS. 8A-8C, there are illustrated the exemplary semiconductor structure shown in FIGS. 7A-7C, respectively, after forming a sacrificial pillar structure 44 in the cut region 43. The sacrificial pillar structure 44 is composed of a same fourth semiconductor material as that used to provide the sacrificial semiconductor material layers 18. The sacrificial pillar structure 44 can be formed by deposition of the fourth semiconductor material, followed by a planarization process such as, for example, CMP. Since the sacrificial pillar structure 44 is composed of a same fourth semiconductor material as each of the sacrificial semiconductor material nanosheets 18NS, the sacrificial pillar structure 44 and each of the sacrificial semiconductor material nanosheets 18NS have a same etch rate and thus each can be subsequently removed from the structure utilizing a same etch.

The pair of reduced channel length nanosheet stacks (i.e., NS2A and NS2B) in the second device region AA2 are now separated by the sacrificial pillar structure 44. The pair of reduced channel length nanosheets NS2A and NS2B have a length less than the original second nanosheet stack NS2.

Figures 9A, 9B:
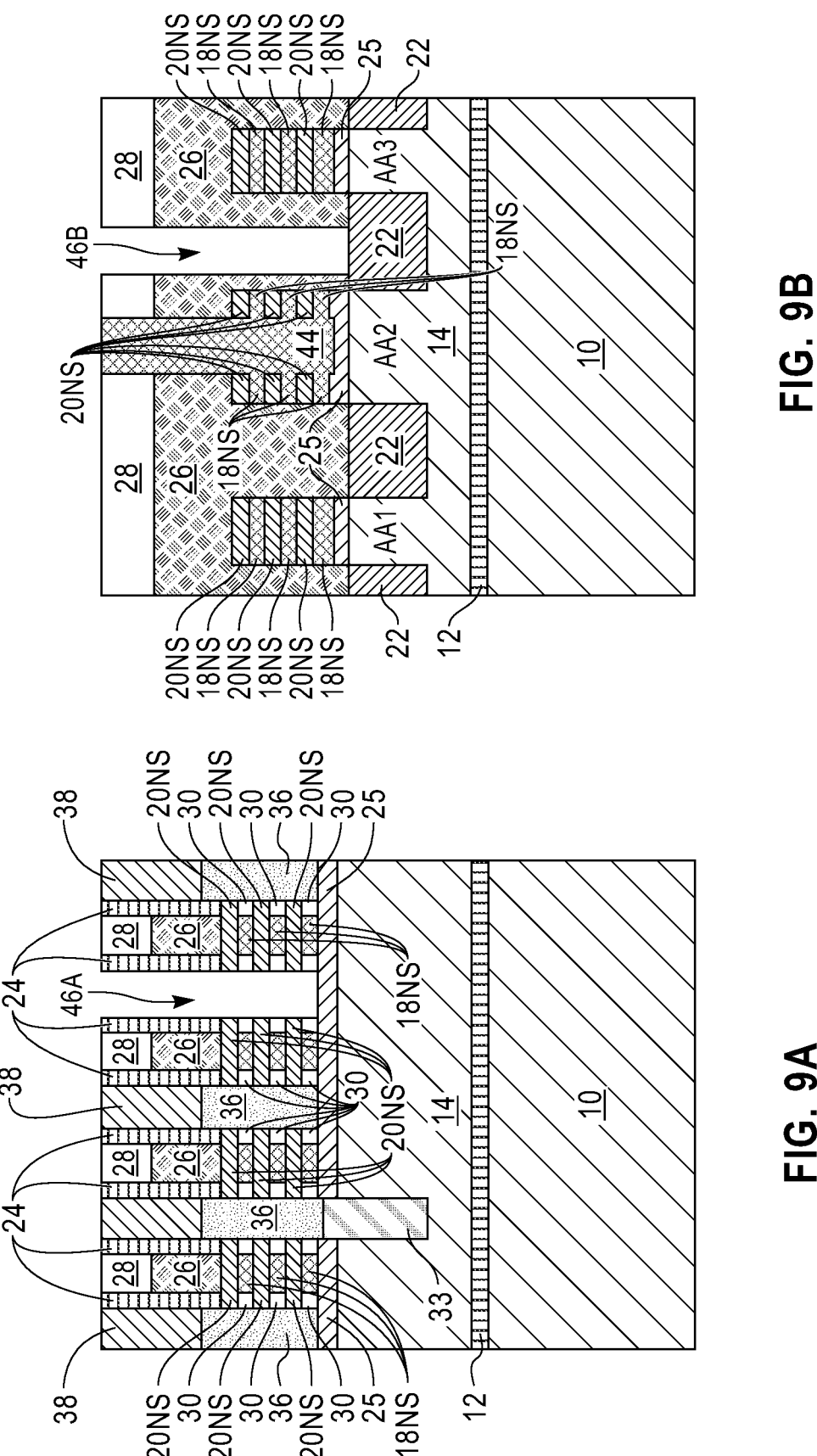
FIGS. 9A-9C are cross sectional views of the exemplary semiconductor structure shown in FIGS. 8A-8C, respectively, after forming a double diffusion break point opening and a gate cut opening.
Figures 9C, 9D:
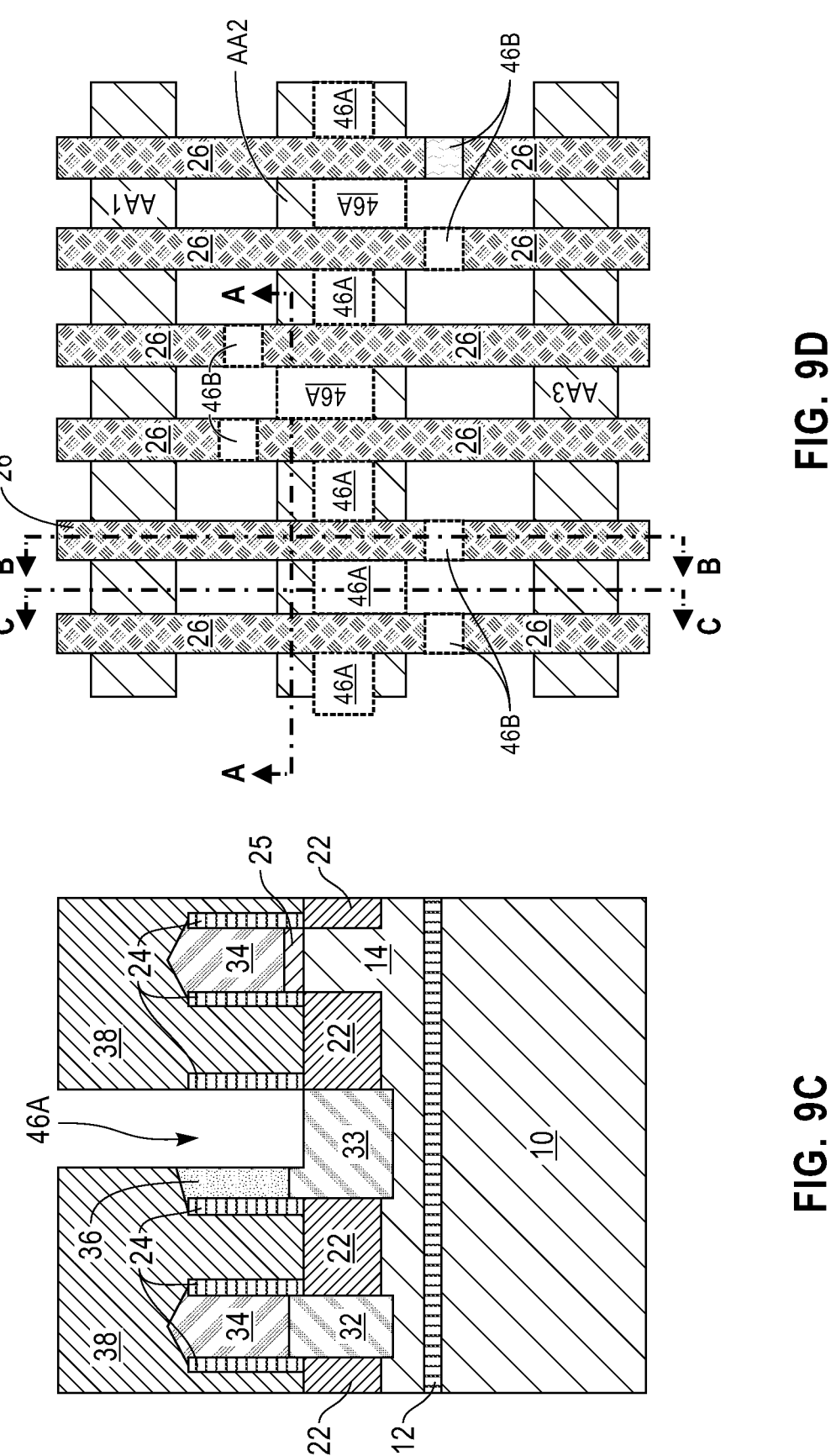
FIG. 9D is a top-down view of the exemplary semiconductor structure shown in FIGS. 9A-9C; some elements shown in the cross sectional views have been omitted for clarity.

Referring now to FIGS. 9A-9C, there are illustrated the exemplary semiconductor structure shown in FIGS. 8A-8C, respectively, after forming a double diffusion break point opening 46A and a gate cut opening 46B. FIG. 9D is a top-down view of the exemplary semiconductor structure shown in FIGS. 9A-9C, the sacrificial gate cap 28 has been omitted for clarity and for comparison with FIG. 10D. In some embodiments (not shown) in the drawings, an additional ILD layer can be formed by deposition and planarization prior to forming the double diffusion break point opening 46A and the gate cut opening 46B. The double diffusion break point opening 46A and the gate cut opening 46B are formed utilizing separate patterning processes. In one embodiment, the double diffusion break point opening 46A is formed prior to the gate cut opening 46B. In another embodiment, this order is switched. The order of forming the double diffusion break point opening 46A and the gate cut opening 46B can vary and is not critical to the present application.

The double diffusion break point opening 46A can be formed by double diffusion break point patterning process that includes lithography and etching. The etch removes physically exposed portions of the first frontside ILD layer 38 and the p-type source/drain regions 36 that are not protected by the lithographic mask. In the second active area AA2, the etch used in forming the double diffusion break point opening 46A stops on a surface of the bottom dielectric isolation layer 25 (See, for example, FIG. 9A). In the source/drain region represented in FIG. 9C, the etch used in forming the double diffusion break point opening 46A stops on a surface, typically a sub-surface, of one of the backside source/drain contact placeholder structures 33.

The gate cut opening 46B can be formed by gate cut patterning process that includes lithography and etching. This etch stop on a surface of one of the shallow trench isolation structures 22 as is shown, for example, in FIG. 9B.

Figures 10A, 10B:
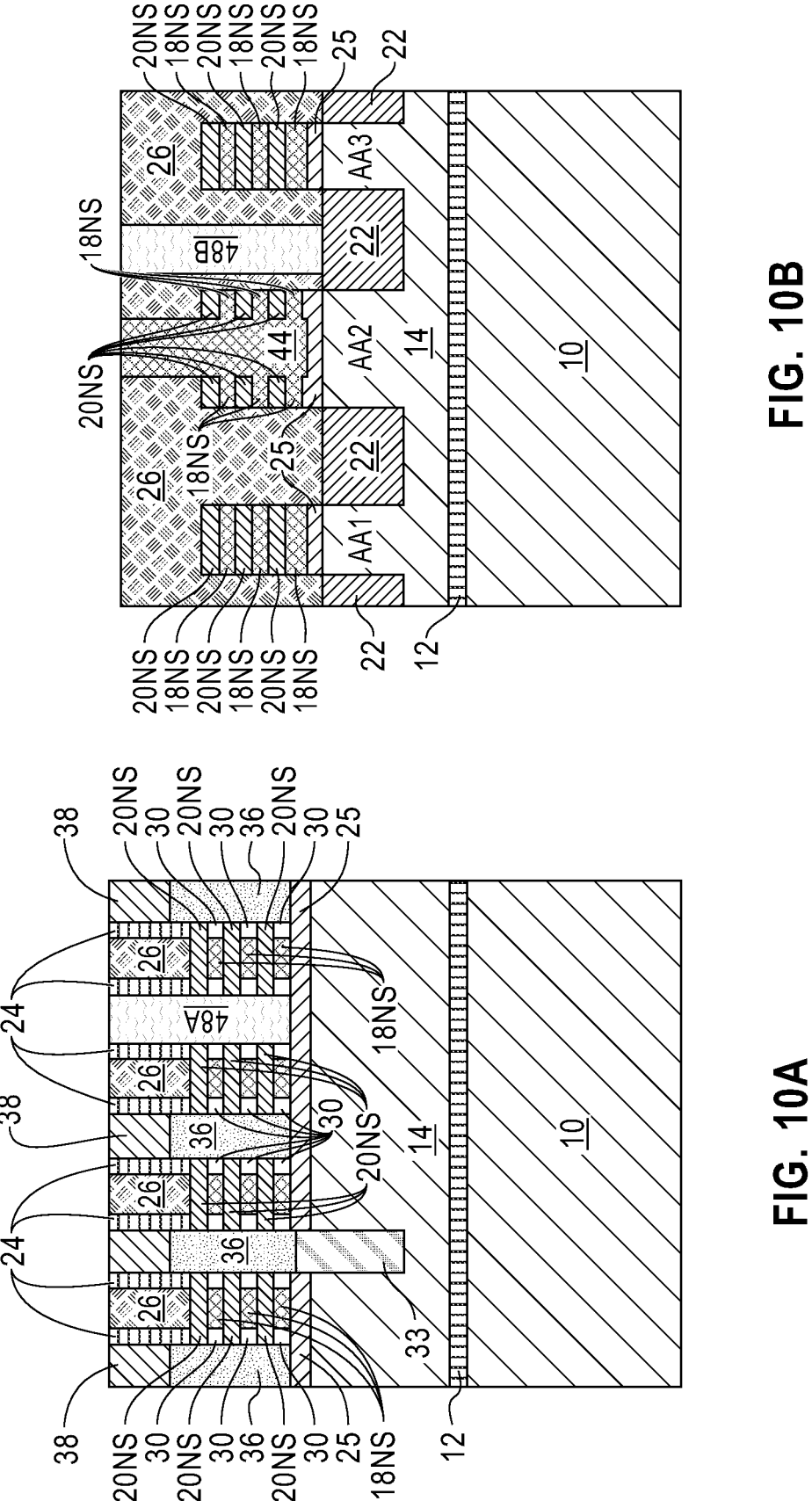
FIGS. 10A-10C are cross sectional views of the exemplary semiconductor structure shown in FIGS. 9A-9C, respectively, after forming a double diffusion break structure in the double diffusion break point opening and a gate cut pillar in the gate cut opening.
Figures 10C, 10D:
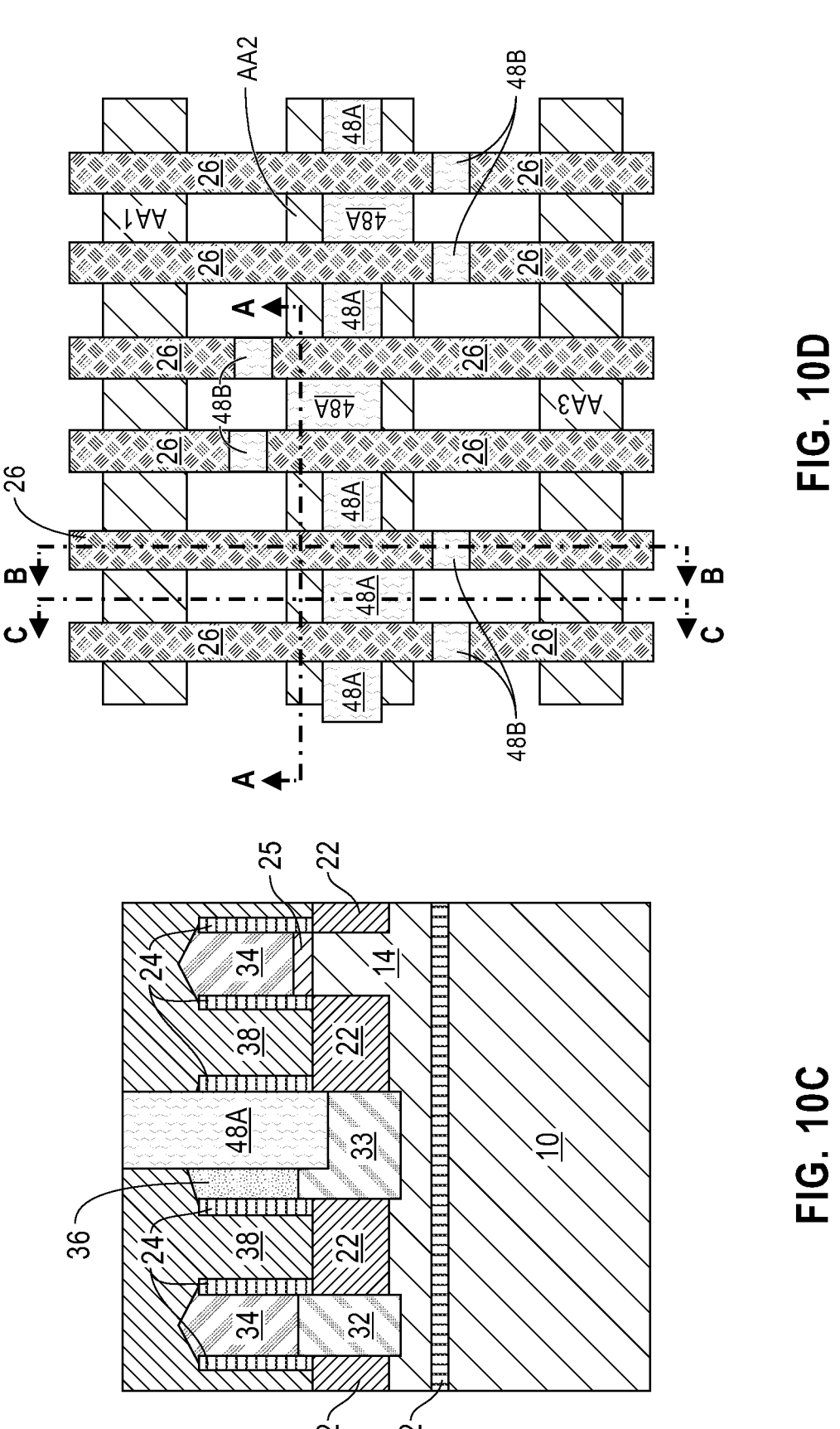
FIG. 10D is a top-down view of the exemplary semiconductor structure shown in FIGS. 10A-10C; some elements shown in the cross sectional views have been omitted for clarity.

Referring now to FIGS. 10A-10C, there are illustrated the exemplary semiconductor structure shown in FIGS. 9A-9C, respectively, after forming a double diffusion break structure 48A in the double diffusion break point opening 46A and a gate cut pillar 48B in the gate cut region 46B. FIG. 10D is a top-down view of the exemplary semiconductor structure shown in FIGS. 10A-10C. The double diffusion break structure 48A and the gate cut pillar 48B are formed simultaneously and are composed of a same dielectric material. The dielectric material that provides both the double diffusion break structure 48A and the gate cut pillar 48B can include SiC, SiOC, SiOCN or any other dielectric material. The double diffusion break structure 48A and the gate cut pillar 48B can be formed by deposition of a dielectric material into both the double diffusion break point opening 46A and the gate cut region 46B, followed by a planarization process such as, for example, CMP. It is noted that the planarization process can also remove the sacrificial gate cap 28 to reveal the sacrificial gate structures 26. The planarization process can also remove upper portions of the dielectric spacer 24, the first frontside ILD layer 38, and the sacrificial pillar structure 44.

As is shown in FIG. 10C, the double diffusion break structure 48A is formed on a sidewall of a remaining portion of one of the p-type source/drain regions 36; the other sidewall of the remaining portion of the p-type source/drain region 36 contacts a sidewall of one of the dielectric spacers 24. In the second device area AA2, the double diffusion break structure 48A lands on the physically exposed surface of the bottom dielectric isolation layer 25 (See, for example, FIG. 10A), while in the source/drain region the double diffusion break structure 48A lands on the physically exposed surface of the backside source/drain contact placeholder structure 33 (See, for example, FIG. 10C). The gate cut pillar 48B lands on a physically exposed surface of the shallow trench isolation structure 22 (See, for example, FIG. 10B).

Figure 11B:
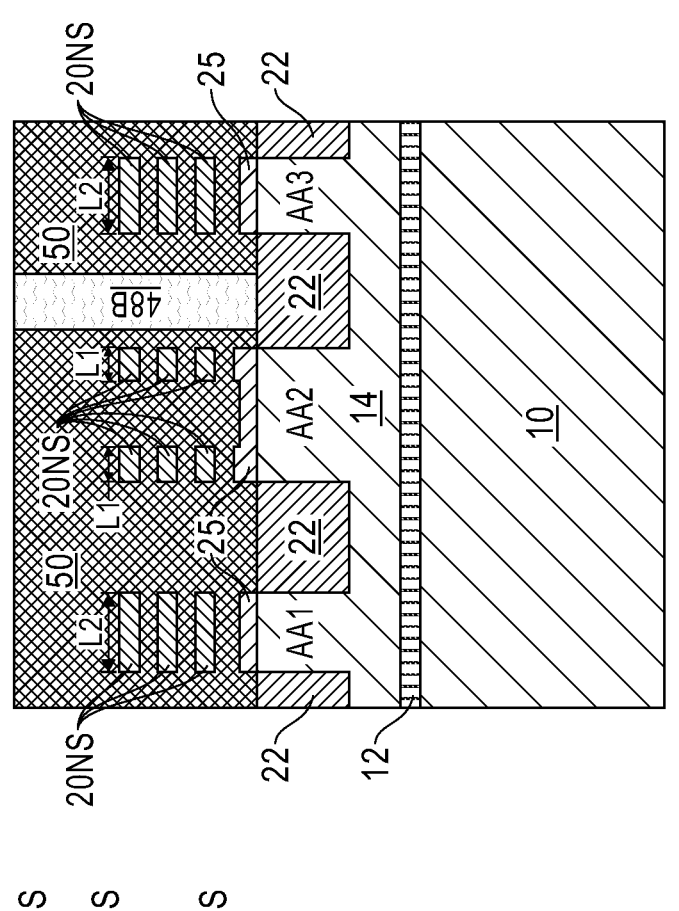
FIGS. 11A-11C are cross sectional views of the exemplary semiconductor structure shown in FIGS. 10A-10C, respectively, after removing the sacrificial gate structures, removing each sacrificial semiconductor material nanosheet and the sacrificial pillar structure, and forming a gate structure.
Figure 11A:
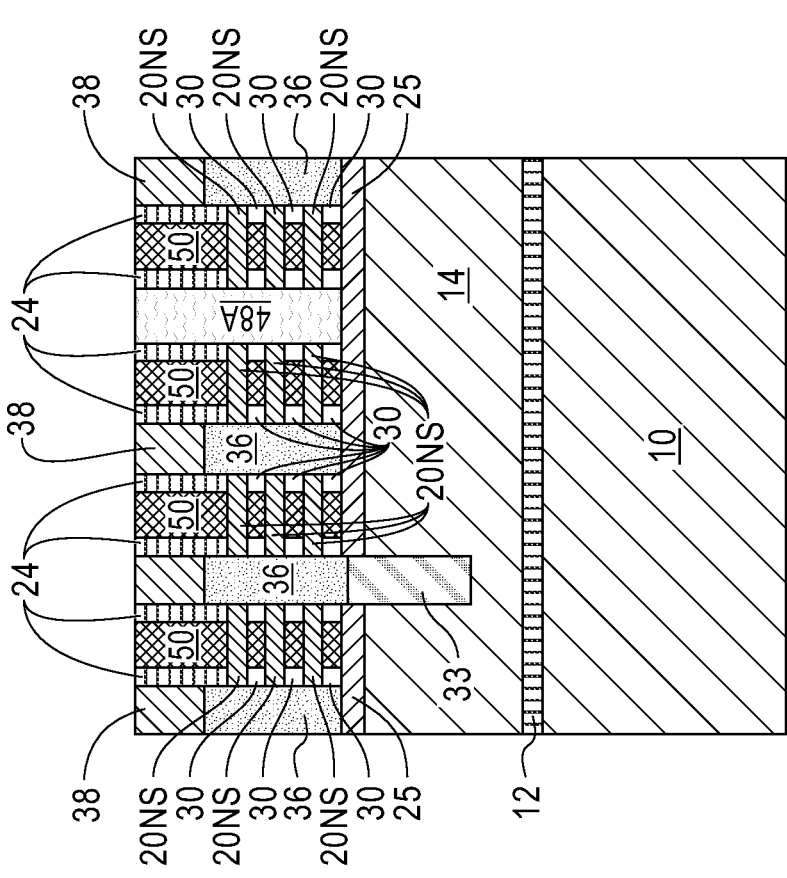
Figures 11C, 11D:
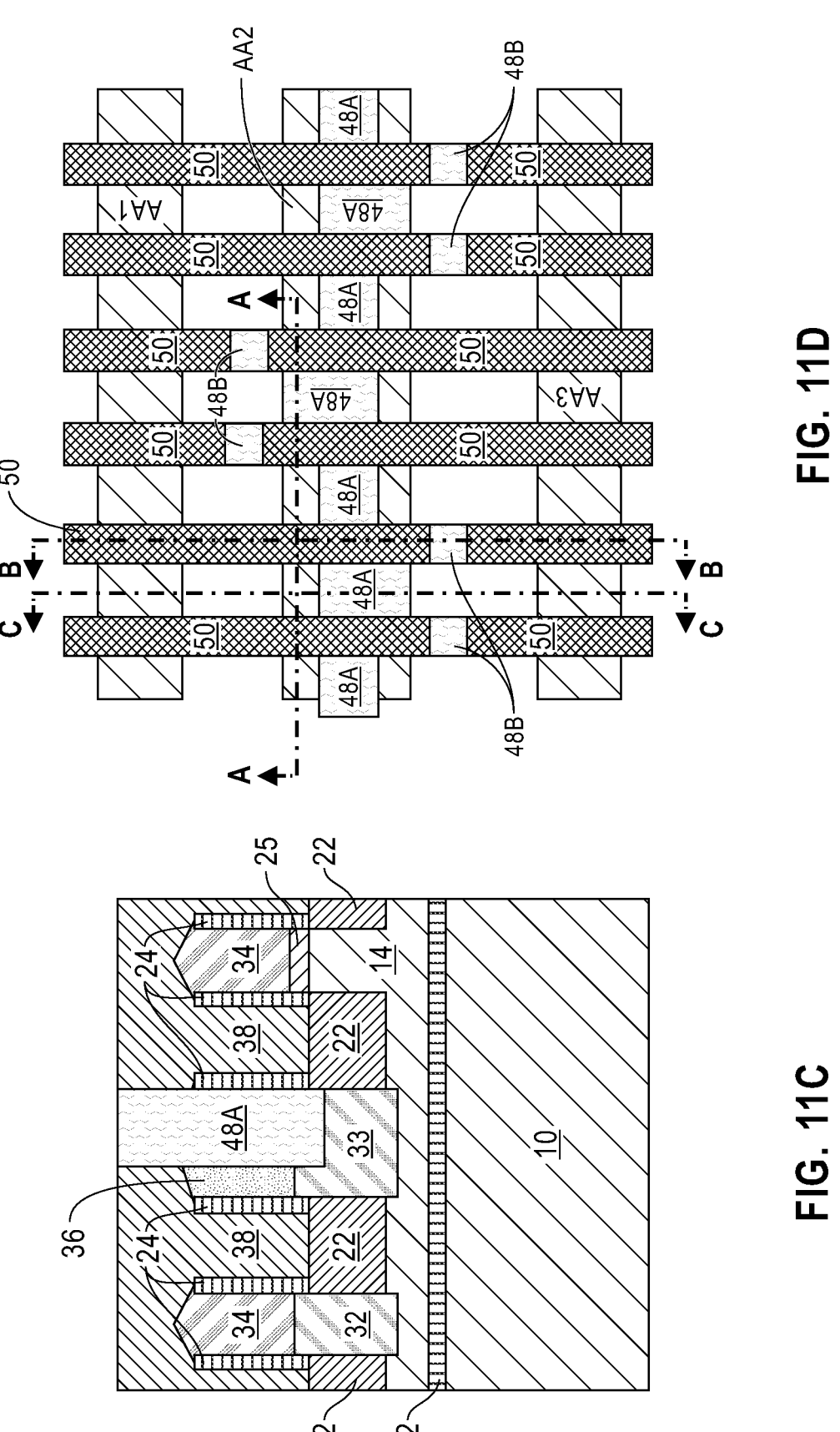
FIG. 11D is a top-down view of the exemplary semiconductor structure shown in FIGS. 11A-11C; some elements shown in the cross sectional views have been omitted for clarity.

Referring now to FIGS. 11A-11C, there are illustrated the exemplary semiconductor structure shown in FIGS. 10A-10C, respectively, after removing the sacrificial gate structures 26, removing each sacrificial semiconductor material nanosheet 18NS and the sacrificial pillar structure 44, and forming a gate structure 50. FIG. 11D is a top-down view of the exemplary semiconductor structure shown in FIGS. 11A-11C.

The sacrificial gate structures 26 can be removed from the structure utilizing a material removal process such as, for example, etching, that is selective in removing the sacrificial gate structures 26. This material removal steps revels the underlying first nanosheet stacks and reduced channel length second nanosheet stacks. After revealing the nanosheet stacks, each sacrificial semiconductor material nanosheet 18NS and the sacrificial pillar structure 44 are removed. The removal of the sacrificial semiconductor material nanosheet 18NS suspends a portion of each semiconductor channel material nanosheet 20NS. Each sacrificial semiconductor material nanosheet 18NS and the sacrificial pillar structure 44 are removed utilizing any material removal process such as, for example, etching, which is selective in removing the sacrificial semiconductor material nanosheets 18NS and the sacrificial pillar structure 44.

The gate structure 50 is formed in the area previously accompanied by the sacrificial semiconductor material nanosheets 18NS and the sacrificial pillar structure 44 as well as atop the topmost semiconductor channel material nanosheet 20NS of each of the nanosheet stacks. The gate structure 50 wraps around each of the semiconductor material nanosheets 20NS within the nanosheet stacks. The gate structure 50 includes a gate dielectric layer and a gate electrode; both the gate dielectric layer and the gate electrode are not separately shown in the drawing, but both are included in the area shown as the gate structure 50. As is known, the gate dielectric layer is formed directly around the suspended portion of each semiconductor channel material nanosheet 20NS and the gate electrode is formed on the gate dielectric layer. The gate dielectric layer of the gate structure 50 is composed of a gate dielectric material that has a dielectric constant of greater than 4.0. Illustrative examples of gate dielectric materials that can be used in providing the gate dielectric layer include, but are not limited to, hafnium dioxide ($HfO_2$), hafnium silicon oxide (HfSiO), hafnium silicon oxynitride (HfSiO), lanthanum oxide ($La_2O_3$), lanthanum aluminum oxide ($LaAlO_3$), zirconium dioxide ($ZrO_2$), zirconium silicon oxide ($ZrSiO_4$), zirconium silicon oxynitride ($ZrSiO_xN_y$), tantalum oxide ($TaO_x$), titanium oxide (TiO), barium strontium titanium oxide ($BaO_6SrTi_2$), barium titanium oxide ($BaTiO_3$), strontium titanium oxide ($SrTiO_3$), yttrium oxide ($Yb_2O_3$), aluminum oxide ($Al_2O_3$), lead scandium tantalum oxide ($Pb(Sc,Ta)O_3$), and/or lead zinc niobite ($Pb(Zn,Nb)O$). The gate dielectric material can further include dopants such as lanthanum (La), aluminum (Al) and/or magnesium (Mg).

The gate electrode of the gate structure 50 is composed of a gate electrode material. The gate electrode material can include a work function metal (WFM) and optionally a conductive metal. The WFM can be used to set a threshold voltage of the transistor to a desired value. In some embodiments, the WFM can be selected to effectuate an n-type threshold voltage shift. "N-type threshold voltage shift" as used herein means a shift in the effective work-function of the work-function metal-containing material towards a conduction band of silicon in a silicon-containing material. In one embodiment, the work function of the n-type work function metal ranges from 4.1 eV to 4.3 eV. Examples of such materials that can effectuate an n-type threshold voltage shift include, but are not limited to, titanium aluminum, titanium aluminum carbide, tantalum nitride, titanium nitride, hafnium nitride, hafnium silicon, or combinations and thereof. In other embodiments, the WFM can be selected to effectuate a p-type threshold voltage shift. In one embodiment, the work function of the p-type work function metal ranges from 4.9 eV to 5.2 eV. As used herein, "threshold voltage" is the lowest attainable gate voltage that will turn on a semiconductor device, e.g., transistor, by making the channel of the device conductive. The term "p-type threshold voltage shift" as used herein means a shift in the effective work-function of the work-function metal-containing material towards a valence band of silicon in the silicon containing material. Examples of such materials that can effectuate a p-type threshold voltage shift include, but are not limited to, titanium nitride, and tantalum carbide, hafnium carbide, and combinations thereof. The optional conductive metal can include, but is not limited to aluminum (Al), tungsten (W), or cobalt (Co). The gate structure 50 can be formed by deposition of the gate dielectric material and the gate electrode material, followed by a planarization process which removes any gate dielectric material and gate electrode material that is formed atop the dielectric spacers 24, first frontside ILD layer 38, the double diffusion break structure 48A and the gate cut pillar 48B. FIG. 11B highlights that the gate length (i.e., first gate length, L1) provided by the semiconductor channel material nanosheets 20NS in the second active area (including the pFETs) is less than the gate length (i.e., second gate length, L2) provided by the semiconductor channel material nanosheets 20NS in the first and third active areas (including the nFETs).

Figures 12A, 12B:
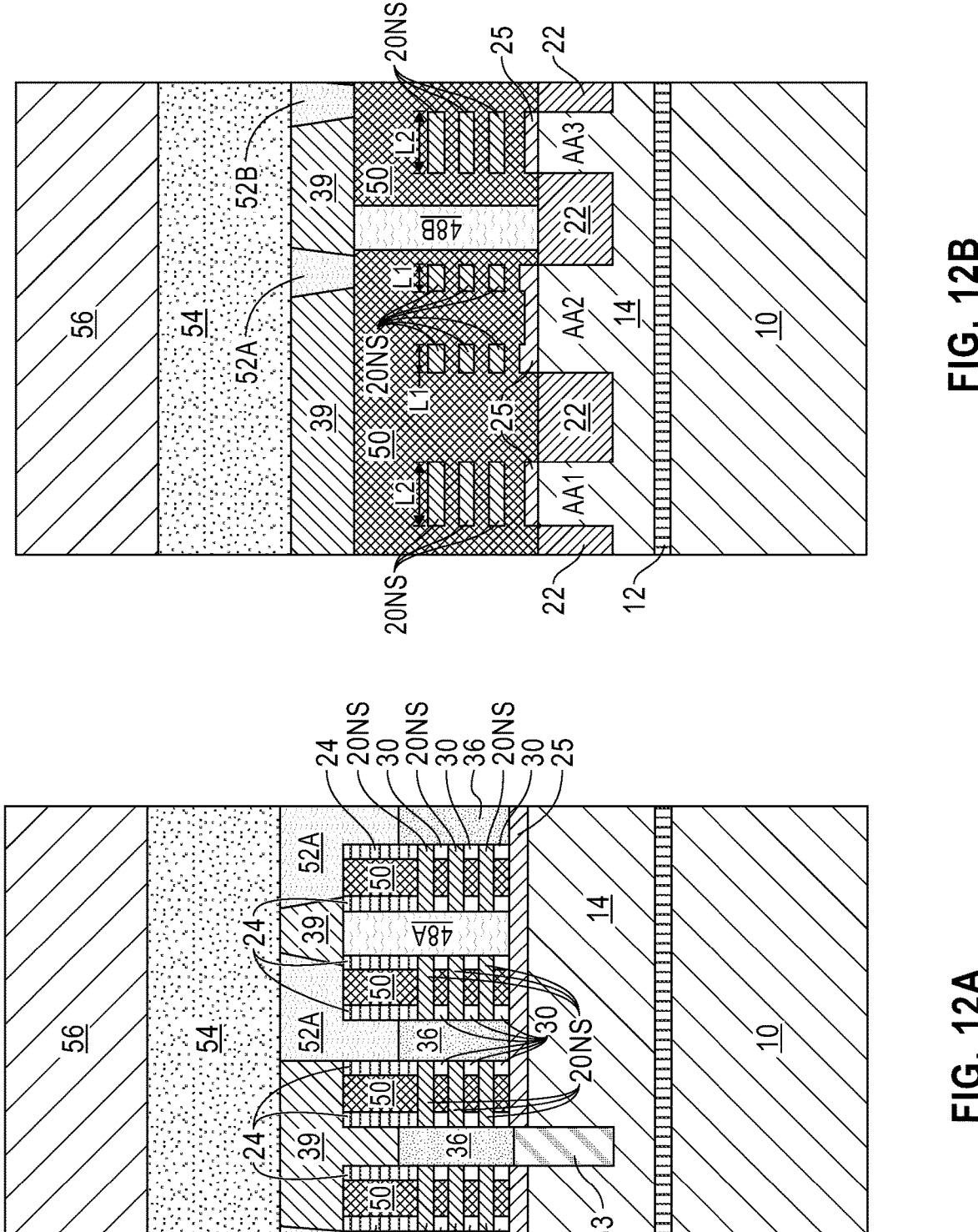
FIGS. 12A-12C are cross sectional views of the exemplary semiconductor structure shown in FIGS. 11A-11C, respectively, after forming a second frontside ILD layer, wherein the first frontside ILD layer and the second frontside ILD layer collectively form a middle-of-the-line (MOL) dielectric layer, forming frontside contact structures in the MOL dielectric layer, and forming a frontside back-end-of-the-line (BEOL) structure and a carrier wafer.
Figures 12C, 12D:
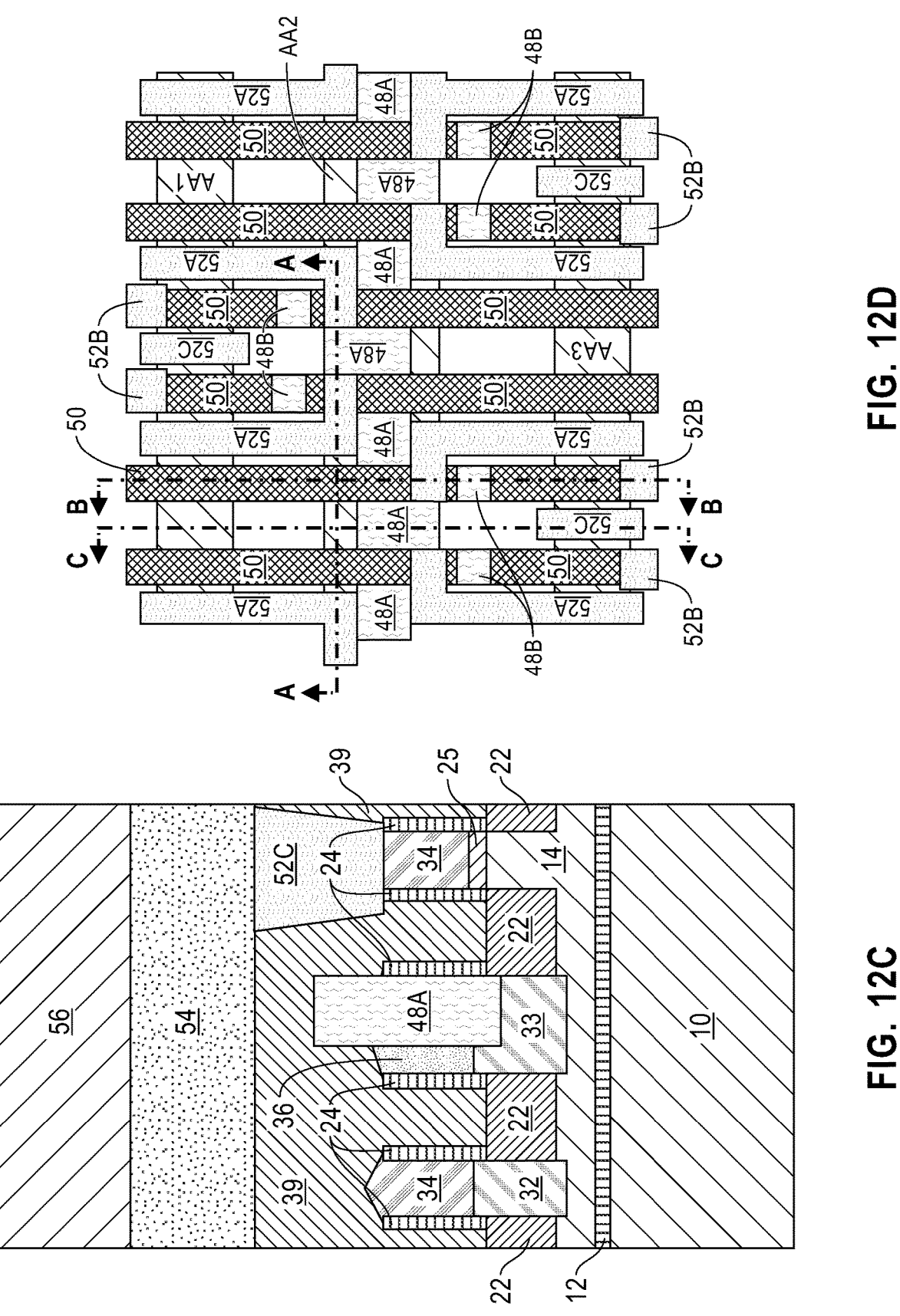
FIG. 12D is a top-down view of the exemplary semiconductor structure shown in FIGS. 12A-12C; some elements such as, for example, the carrier wafer, the frontside BEOL structure and the MOL dielectric layer are not shown in FIG. 12D for clarity.

Referring now to FIGS. 12A-12C, there are illustrated the exemplary semiconductor structure shown in FIGS. 11A-11C, respectively, after forming a second frontside ILD layer, wherein the first frontside ILD layer 38 and the second frontside ILD layer collectively form a MOL dielectric layer 39, forming frontside contact structures in the MOL dielectric layer 39, and forming a frontside BEOL structure 54 and a carrier wafer 56. FIG. 12D is a top-down view of the exemplary semiconductor structure shown in FIGS. 12A-12C; some elements such as, for example, the carrier wafer 56, the frontside BEOL structure 54 and the MOL dielectric layer 39 are not shown in FIG. 12D for clarity.

The second frontside ILD layer includes one of the dielectric materials mentioned above for the first frontside ILD layer 38. The second frontside ILD layer can be formed utilizing one of the deposition processes mentioned above in forming the first frontside ILD layer 38. The dielectric material that provides the second frontside ILD layer can be compositionally the same as, or compositionally different from, the dielectric material that provides the first frontside ILD layer 38.

After forming the second frontside ILD layer, the frontside contact structures are formed in the MOL dielectric layer 39. The frontside contact structures include crosscouple (XC) frontside contact structures 52A, gate contact structures 52B and source/drain contact structures 52C. In the illustrated embodiment, XC frontside contact structures 52A electrically connects the gate structure 50 of a first CMOS to shared n/p source/drain regions of a second CMOS. In the present application, the gate contact structure 52B is electrically contacting the gate electrode 50 of the transistors. In the present application, source/drain contact structures 52C electrically contacts one of the source/drain regions of a transistor. The frontside contact structures are formed utilizing a metallization process. The metallization process includes forming contact openings into the MOL dielectric layer 39 (by lithography and etching) and then filling (including deposition and planarization) those contact openings with at least a contact conductor material. The contact conductor material that can be used for providing the frontside contact structures includes, for example, a silicide liner, such as Ni, Pt, NiPt, an adhesion metal liner, such as TiN, and conductive metals such as W, Cu, Al, Co, Ru, Mo, Os, Ir, Rh, or an alloy thereof. The frontside contact structures can also include one or more contact liners (not shown). In one or more embodiments, the contact liner (not shown) can include a diffusion barrier material. Exemplary diffusion barrier materials include, but are not limited to, Ti, Ta, Ni, Co, Pt, W, Ru, TiN, TaN, WN, WC, an alloy thereof, or a stack thereof such as Ti/TiN and Ti/WC. In one or more embodiments in which a contact liner is present, the contact liner (not shown) can include a silicide liner, such as Ti, Ni, NiPt, etc., and a diffusion barrier material, as defined above. A planarization process such as, for example, CMP, follows the filling of the contact openings.

Next, frontside BEOL structure 54 is formed on the uppermost surface of the MOL dielectric layer 39 utilizing techniques that are well known in the art. The frontside BEOL structure 54 can include one or more interconnect dielectric material layers (including one of the dielectric materials mentioned above for the first frontside ILD layer 38) that contain frontside metal wires (the metal wires can be composed of any electrically conductive metal or electrically conductive metal alloy) embedded therein. Electrical contact of the frontside BEOL structure 54 to each frontside contact structures is made.

The carrier wafer 56 can include one of the semiconductor materials mentioned above for the first semiconductor layer 10. Carrier wafer 56 is bonded to the frontside BEOL structure 54 after frontside BEOL structure 54 formation.

Figure 13A:
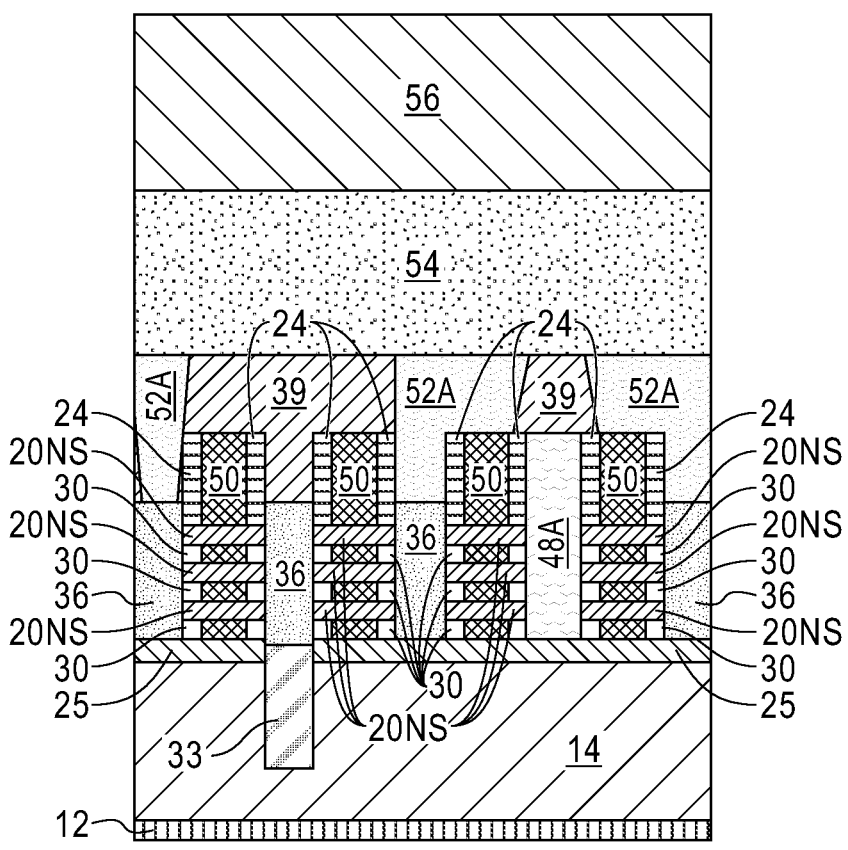
FIGS. 13A-13C are cross sectional views of the exemplary semiconductor structure shown in FIGS. 12A-12C, respectively, after removing a second semiconductor layer of the substrate.
Figures 13B, 13C:
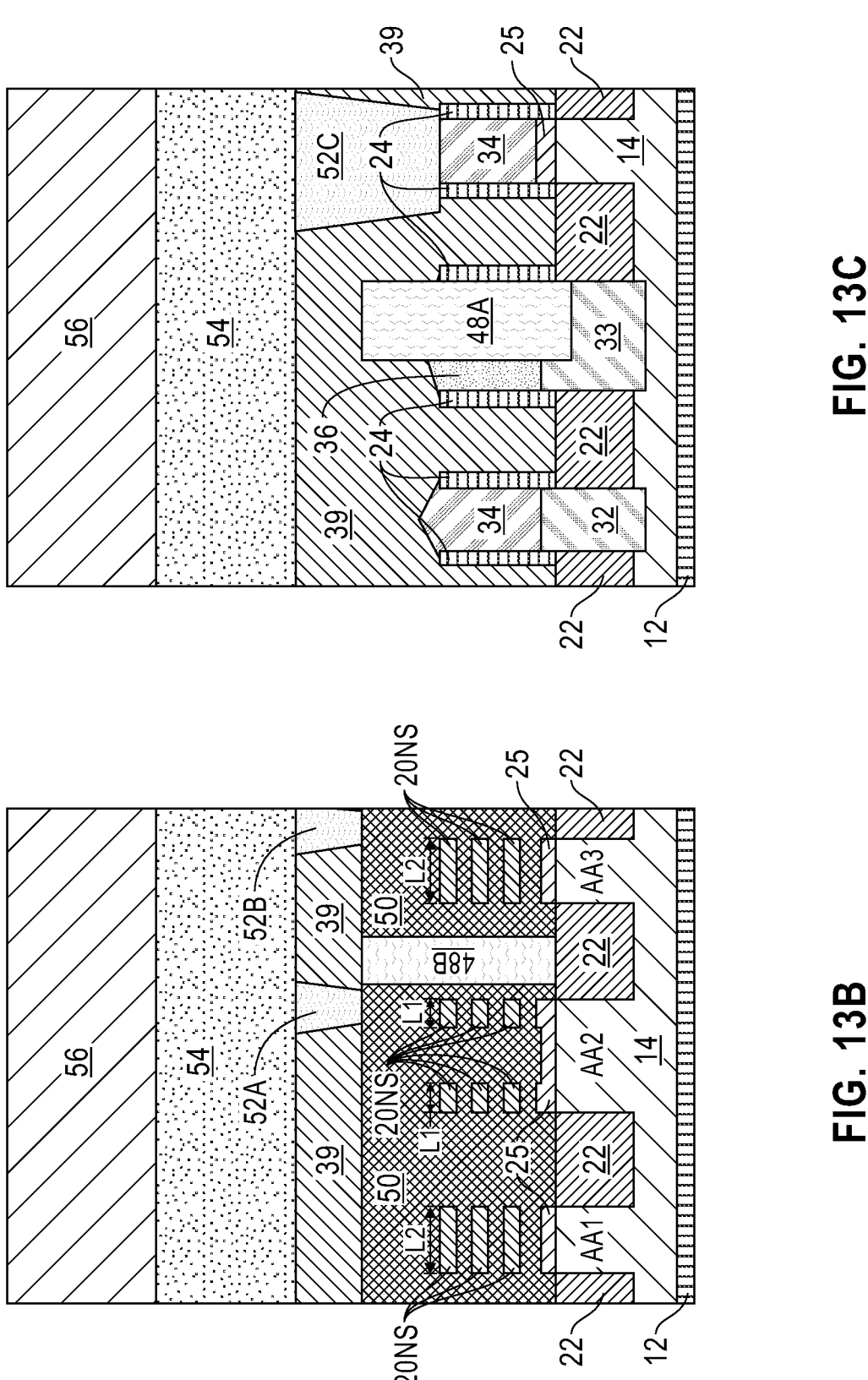

Referring now to FIGS. 13A-13C, there are illustrated the exemplary semiconductor structure shown in FIGS. 12A-12C, respectively, after removing the first semiconductor layer 10 of the substrate to reveal the etch stop layer 12. The removal of the first semiconductor layer 10 typically includes flipping the wafer 180° to physically expose a backside of the substrate. This flipping step is not shown in the drawings of the present application for clarity. The flipping physically exposes the first semiconductor layer 10 and will allow backside processing of the exemplary structure. Flipping of the structure can be performed by hand or by utilizing a mechanical means such as, for example, a robot arm. In the illustrated embodiment, the removal of the physically exposed first semiconductor layer 10 physically exposes the etch stop layer 12. The removal of the first semiconductor layer 10 can be performed utilizing a material removal process that is selective in removing the first semiconductor material that provides the first semiconductor layer 10.

Figure 14A:
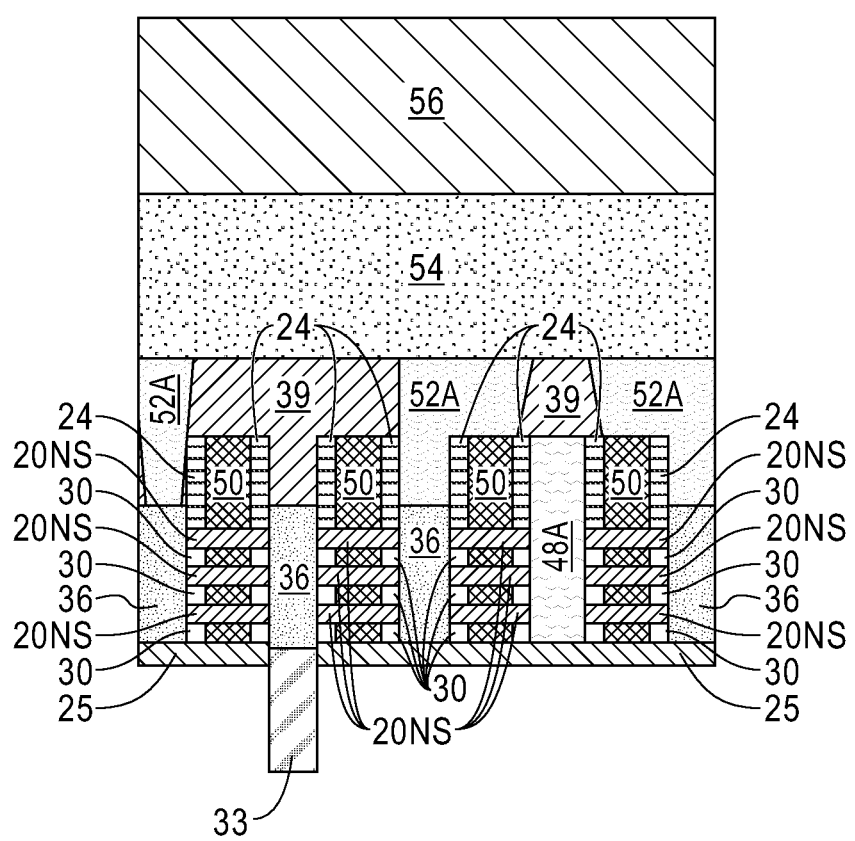
FIGS. 14A-14C are cross sectional views of the exemplary semiconductor structure shown in FIGS. 13A-13C, respectively, after removing an etch stop layer and a first semiconductor layer of the substrate.
Figures 14B, 14C:
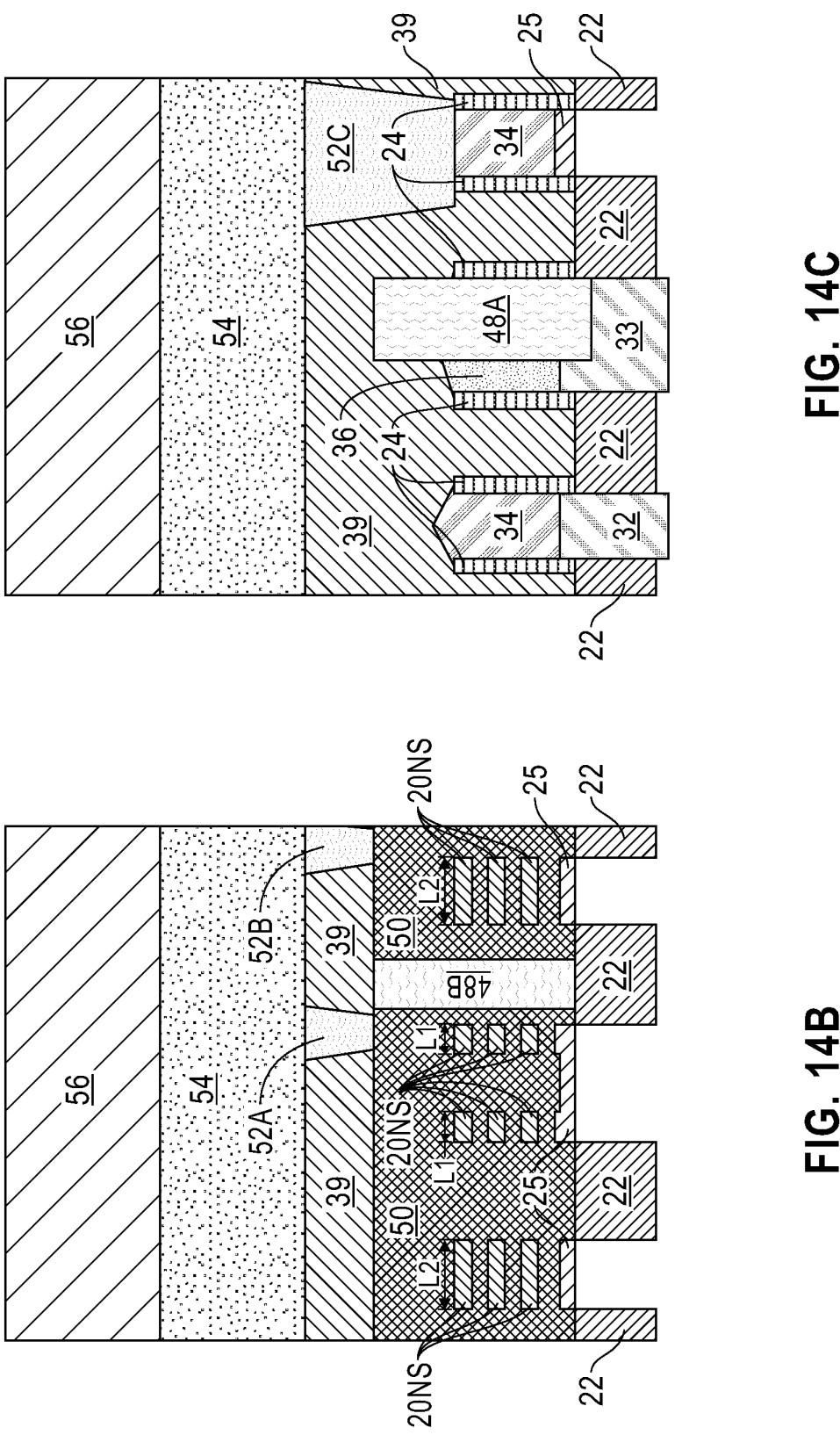

Referring now to FIGS. 14A-14C, there are illustrated the exemplary semiconductor structure shown in FIGS. 13A-13C, respectively, after removing the etch stop layer 12 and the second semiconductor layer 14 of the substrate. The removal of the etch stop layer 12 includes a material removal process that is selective in removing the etch stop layer 12. The removal of the etch stop layer 12 physically exposes the second semiconductor layer 14. The physically exposed second semiconductor layer 14 can be removed utilizing a material removal process that is selective in removing that layer from the structure. As is illustrated in FIGS. 14A-14C, the removal of the substrate reveals the shallow trench isolation structures 22 and backside source/drain contact placeholder structures 32, 33.

Figure 15A:
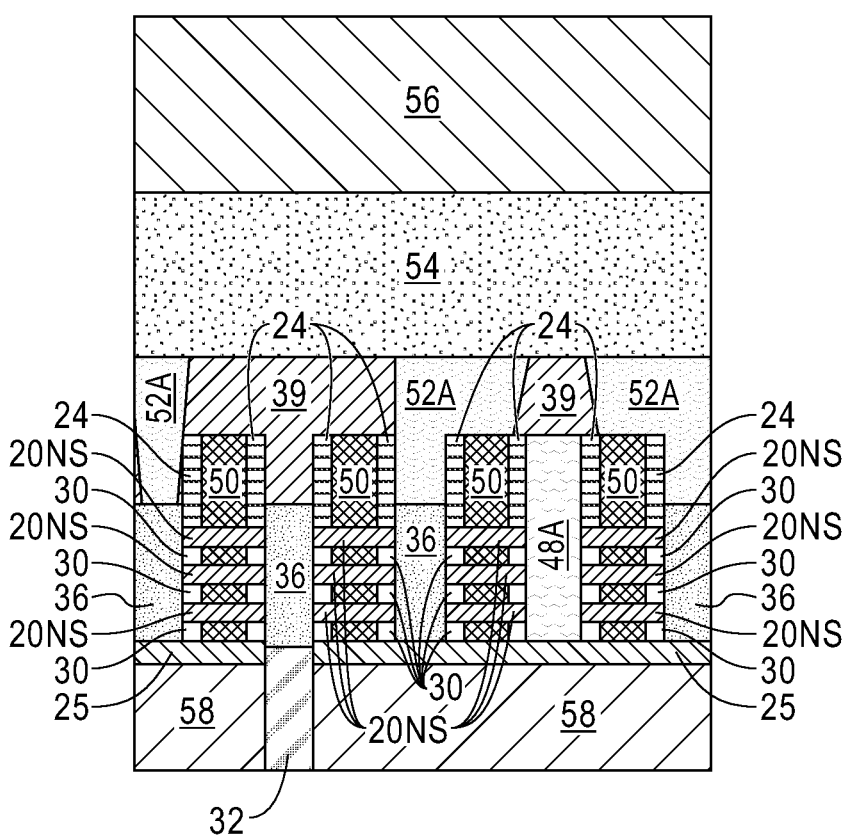
FIGS. 15A-15C are cross sectional views of the exemplary semiconductor structure shown in FIGS. 14A-14C, respectively, after forming a first backside ILD layer.
Figures 15B, 15C:
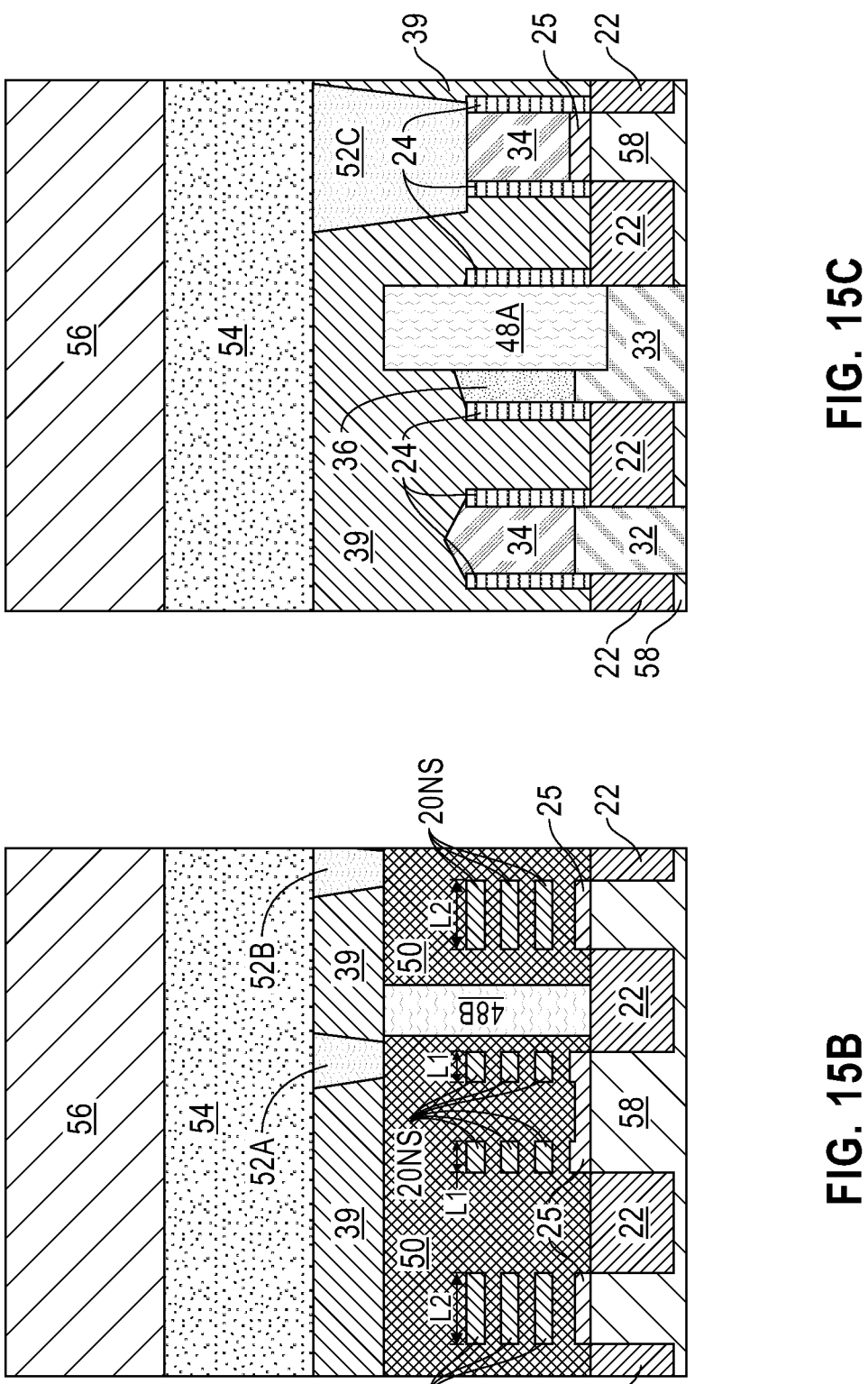

Referring now to FIGS. 15A-15C, there are illustrated the exemplary semiconductor structure shown in FIGS. 14A-14C, respectively, after forming a first backside ILD layer 58. The backside ILD layer 58 includes one of the dielectric materials mentioned above for the first frontside ILD layer 38. The backside ILD layer 58 can be formed utilizing one of the deposition processes mentioned above in forming the first frontside ILD layer 38. Following deposition of the dielectric material, a planarization process is employed to reveal each of the backside source/drain contact placeholder structures 32, 33.

Figure 16A:
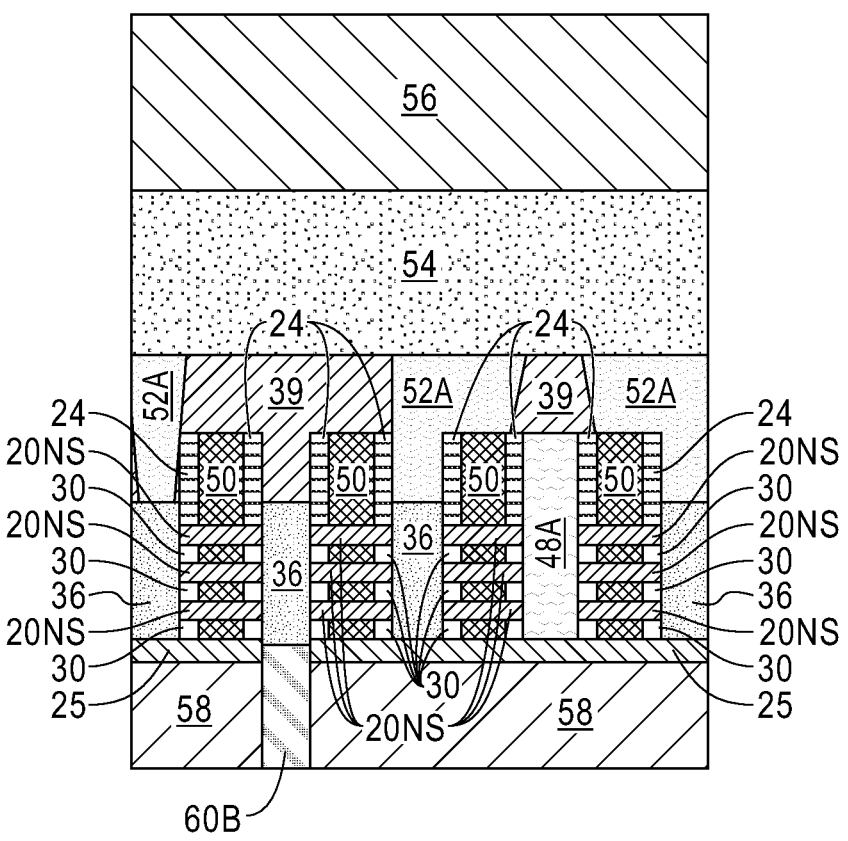
FIGS. 16A-16C are cross sectional views of the exemplary semiconductor structure shown in FIGS. 15A-15C, respectively, after removing the backside source/drain contact placeholder structures and forming backside contact structures in the first backside ILD layer.
Figures 16B, 16C:
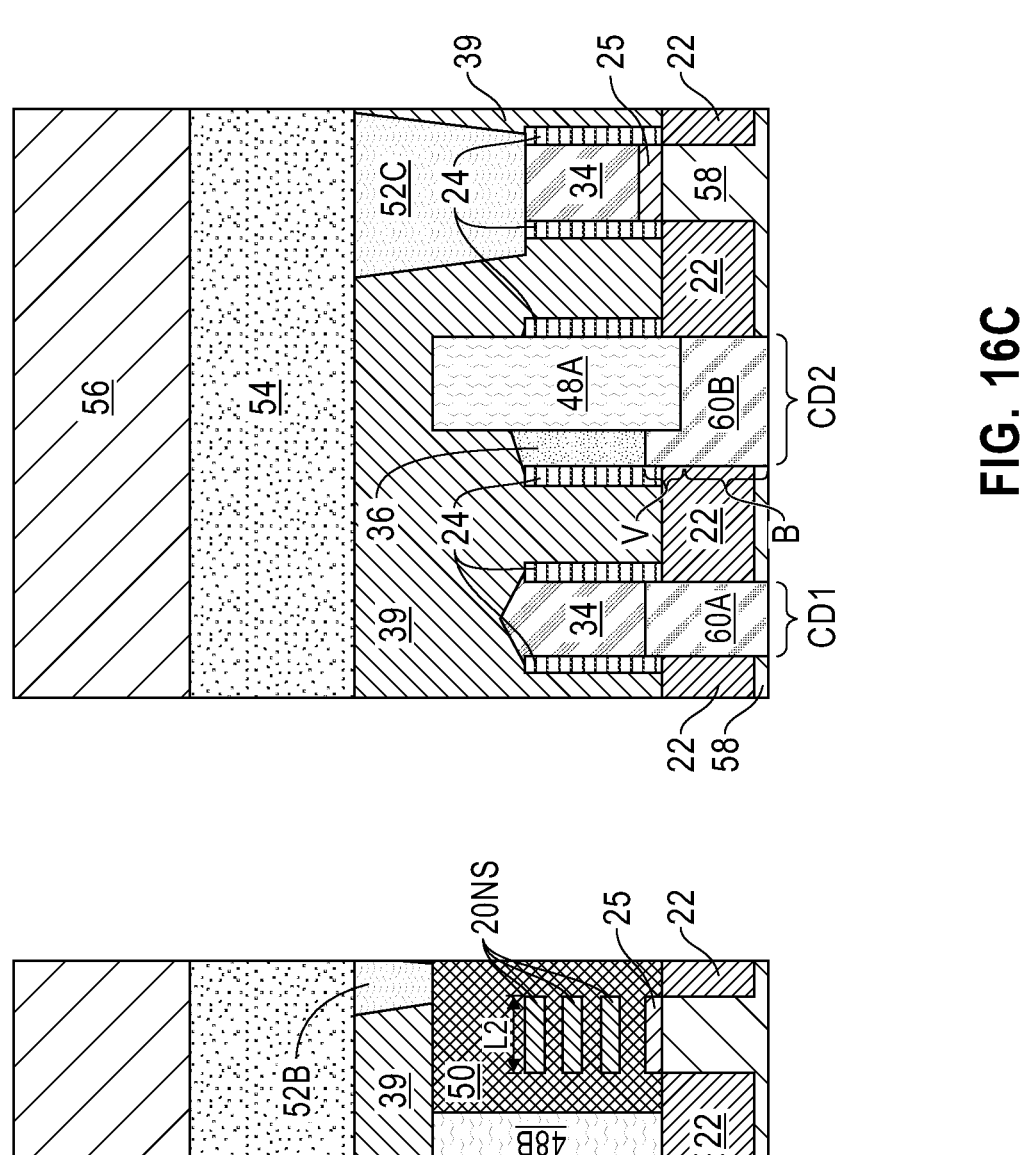

Referring now to FIGS. 16A-16C, there are illustrated the exemplary semiconductor structure shown in FIGS. 15A-15C, respectively, after removing the backside source/drain contact placeholder structures 32, 33 and forming backside contact structures in the first backside ILD layer 58. The removal of the backside source/drain contact placeholder structures 32, 33 includes a material removal process such as, for example, an etch, that is selective in removing the revealed backside source/drain contact placeholder structures 32, 33. This removal step forms backside source/drain contact openings (not shown) in the first backside ILD layer 58.

Backside source/drain contact structures are then formed into each backside source/drain contact openings. Backside source/drain contact structure formation includes filling (including deposition and planarization) the backside source/drain contact openings with at least a contact conductor material, as defined above. Notably, the contact conductor material that can be used for providing the backside source/drain contact structures includes, for example, a silicide liner, such as Ni, Pt, NiPt, an adhesion metal liner, such as TiN, and conductive metals such as W, Cu, Al, Co, Ru, Mo, Os, Ir, Rh, or an alloy thereof. The backside contact structures can also include one or more contact liners (not shown). In one or more embodiments, the contact liner (not shown) can include a diffusion barrier material. Exemplary diffusion barrier materials include, but are not limited to, Ti, Ta, Ni, Co, Pt, W, Ru, TiN, TaN, WN, WC, an alloy thereof, or a stack thereof such as Ti/TiN and Ti/WC. In one or more embodiments in which a contact liner is present, the contact liner (not shown) can include a silicide liner, such as Ti, Ni, NiPt, etc., and a diffusion barrier material, as defined above.

In the present application, the backside source/drain contact structures include a first backside contact structure 60A contacting one of the n-doped source/drain regions 34, and a second backside contact structure 60B having a vertical portion V and a base portion B. In the present application, the vertical portion V of the second backside contact structure 60B directly contacts one of the p-doped source/drain regions 34 of the transistor. In the present application, the first backside contact structure 60A has a first critical dimension CD1 that is constant throughout an entirety of the first backside contact structure 60A (as measured from one sidewall of first backside contact structure 60A to another sidewalls of the first backside contact structure 60A and from bottom to top of the first backside contact structure 60A), while the base portion B of the second backside contact structure 60B has a second critical dimension CD2 that is greater than the first critical dimension CD1. In the present application, the vertical portion V of the second backside contact structure 60B has a third critical dimension CD3. In embodiments of the present application, the third critical dimension CD3 is less than both the first critical dimension CD1 and the second critical dimension CD2.

Figure 17A:
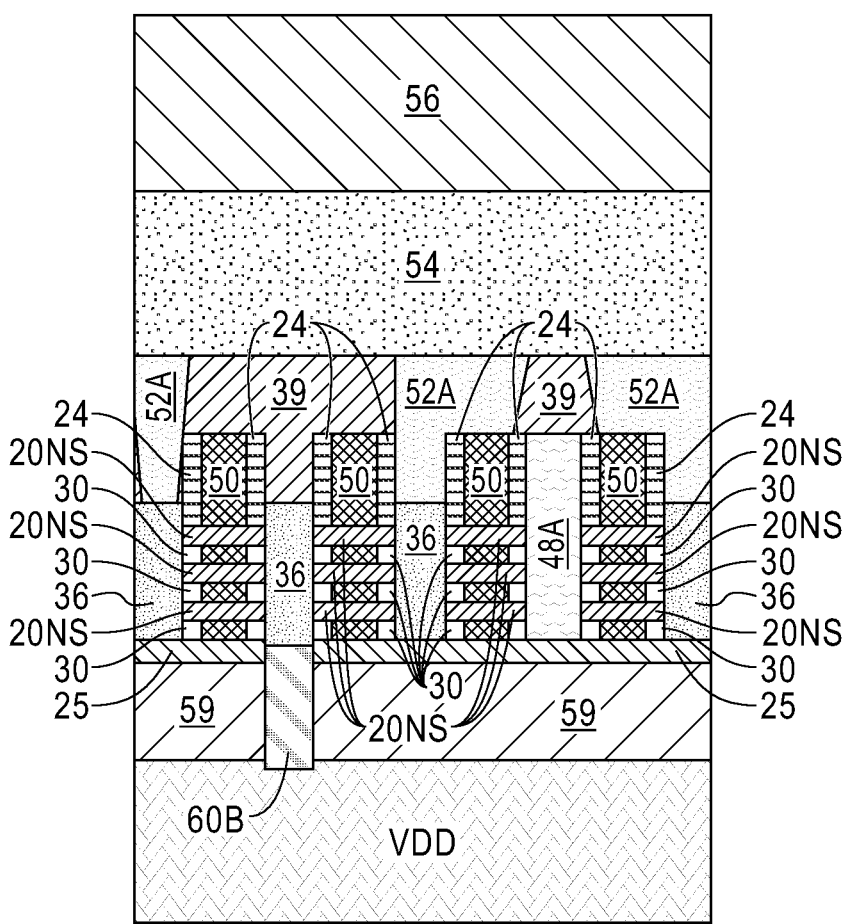
FIGS. 17A-17C are cross sectional views of the exemplary semiconductor structure shown in FIGS. 16A-16C, respectively, after forming a second backside ILD layer, wherein the first backside ILD layer and the second backside ILD layer collectively provide a multilayered backside ILD structure, and forming VDD and VSS power supplies in the multilayered backside ILD structure.
Figures 17B, 17C:
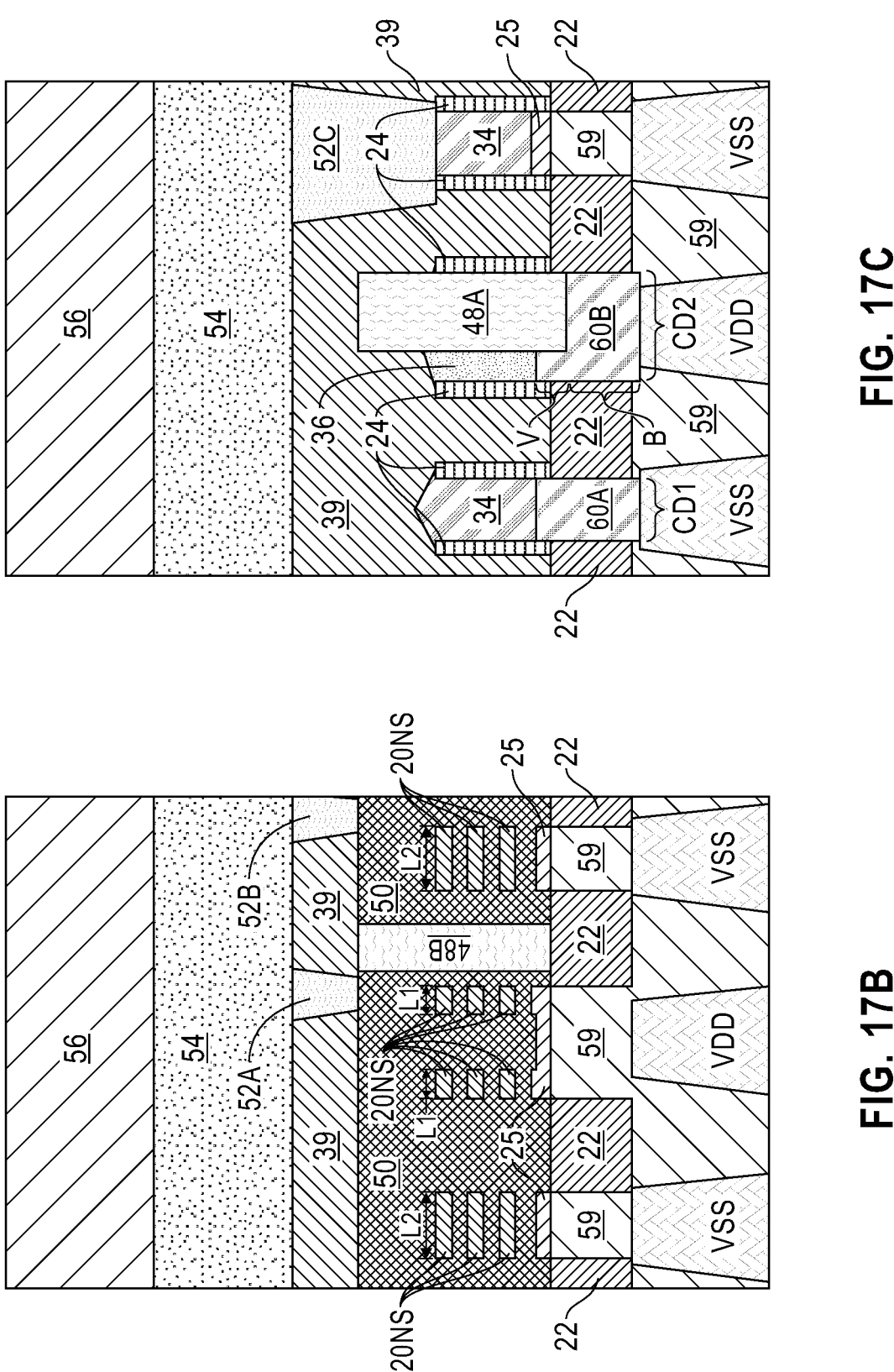

Referring now to FIGS. 17A-17C, there are illustrated the exemplary semiconductor structure shown in FIGS. 16A-16C, respectively, after forming a second backside ILD layer, wherein the first backside ILD layer 58 and the second backside ILD layer collectively provide a multilayered backside ILD structure 59, and forming VDD and VSS power supplies in the multilayered backside ILD structure 59.

The second backside ILD layer includes one of the dielectric materials mentioned above for the first frontside ILD layer 38. The second backside ILD layer can be formed utilizing one of the deposition processes mentioned above in forming the first frontside ILD layer 38. The dielectric material that provides the second backside ILD layer can be compositionally the same as, or compositionally different from, the dielectric material that provides the first backside ILD layer 58.

The VDD and VSS power supplies are composed of any electrically conductive material including, but not limited to, tungsten (W), cobalt (Co), ruthenium (Ru), aluminum (Al), copper (Cu), platinum (Pt), rhodium (Rh), or palladium (Pd). A diffusion barrier, not shown, can be present on at least the sidewalls of the VDD and VSS power supplies. The VDD and VSS power supplies can be formed utilizing a damascene process. In some embodiments, a subtractive etch process can be used to formed the VSS and VDD power supplies and thereafter the second backside ILD layer is formed embedding the VSS and VDD power supplies.

Figure 18A:
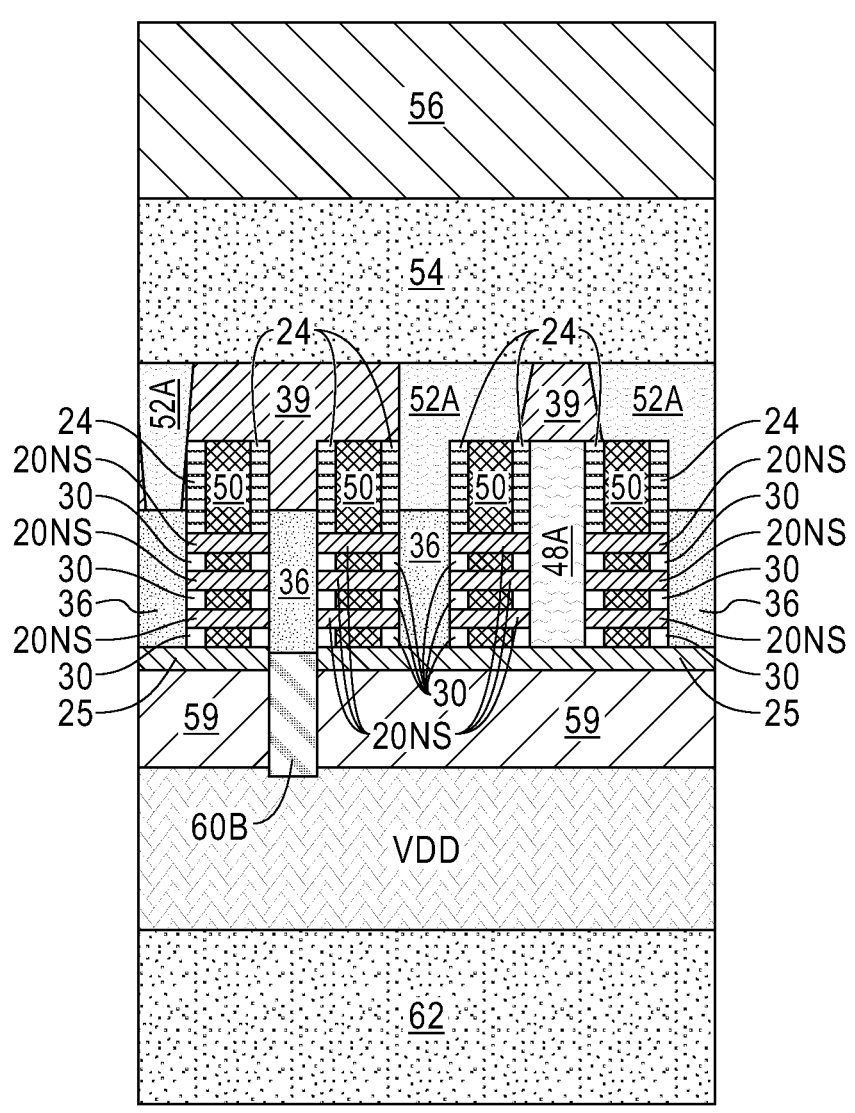
FIGS. 18A-18C are cross sectional views of the exemplary semiconductor structure shown in FIGS. 17A-17C, respectively, after forming a backside interconnect structure.
Figures 18B, 18C:
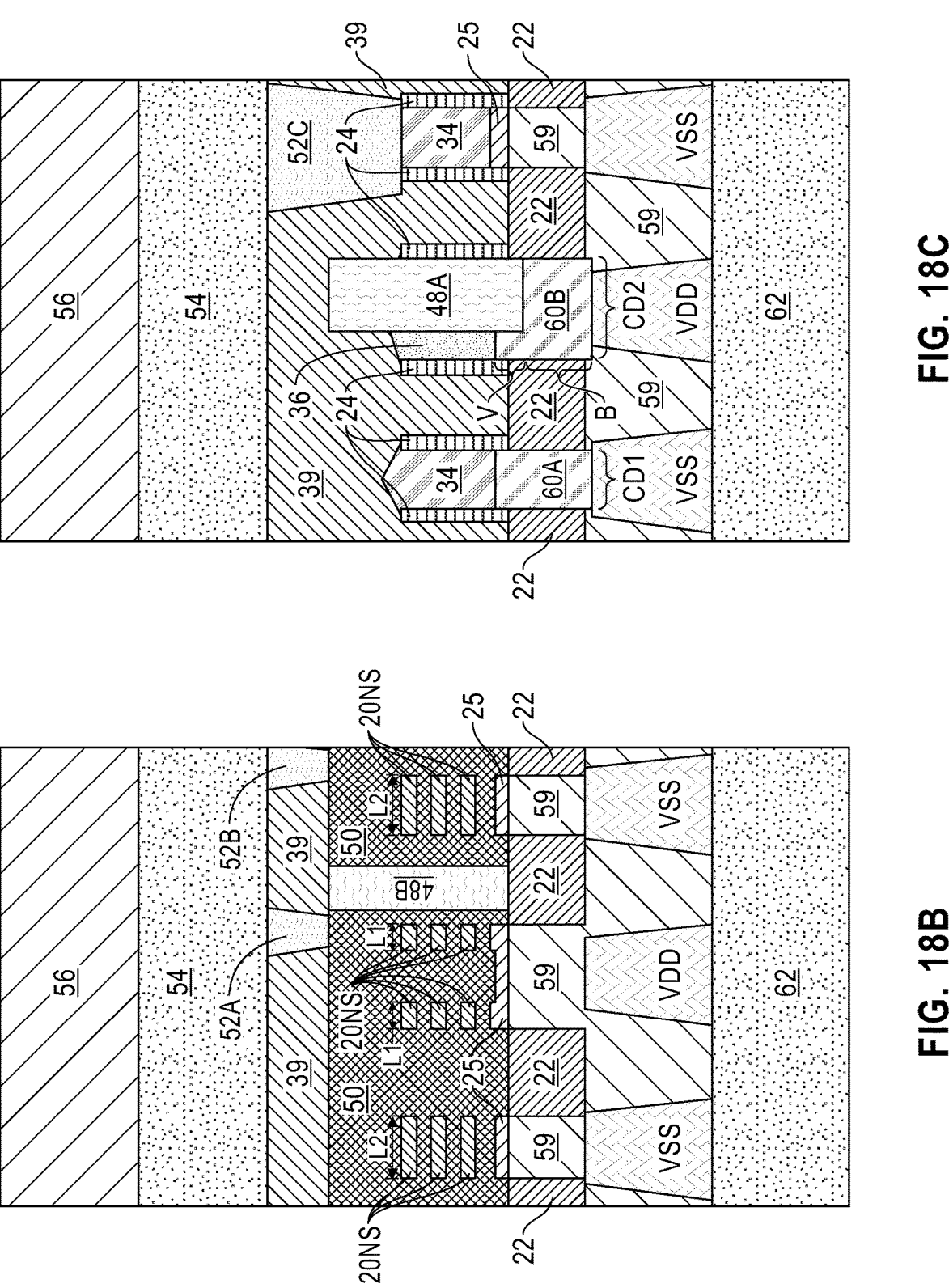

Referring now to FIGS. 18A-18C, there are illustrated the exemplary semiconductor structure shown in FIGS. 17A-17C, respectively, after forming a backside interconnect structure 62. The backside interconnect structure 62 is formed on physically exposed surfaces of multilayered backside ILD structure 59 and each of the VDD and VSS power supplies utilizing techniques well known in the art. The backside interconnect structure 62 can include one or more interconnect dielectric material layers (including one of the dielectric materials mentioned above for the first frontside ILD layer 38) that contain backside metal wires (the metal wires can be composed of any electrically conductive metal or electrically conductive metal alloy) embedded therein. The backside interconnect structure 62 can be used as a backside power distribution network.

Notably, FIGS. 18A-18C illustrated a SRAM in accordance with the present application. The SRAM includes a first pull-up transistor (i.e., pFET) having a first channel length L1 and a first pull-down transistor (i.e., nFET) located adjacent to the first pull-up transistor (i.e., nFET) and having a second channel length L2, wherein the second channel length L2 is greater than the first channel length L1. The SRAM further includes first backside contact structure 60A contacting a first n-doped source/drain region 34 of the first pull-down transistor. The first backside contact structure 60A has CD1 that is constant throughout an entirety of the first backside contact structure 60A. The SRAM even further includes second backside contact structure 60B having a vertical portion V and a base portion B. The vertical portion V of the second backside contact structure 60B directly contacts a first p-doped source/drain region 36 of the first pull-up transistor and the base portion B of the second backside contact structure 60B has CD2 that is greater than CD1.

In some embodiments, the vertical portion V of second backside contact structure 60B has CD3, wherein the CD3 is less than both CD1 and CD2.

In embodiments, the n-doped source/drain region 34 of the first pull-down transistor is confined between a pair of dielectric spacers 24.

In embodiments, the p-doped source/drain region 36 of the first pull-up transistor is confined on a first side by dielectric spacer 24 and on a second side by double diffusion break structure 48A.

In embodiments, the double diffusion break structure 48A directly contacts a surface of the base portion B of the second backside contact structure 60B.

In embodiments, the first pull-down transistor is located in AA1 and the first pull-up transistor is located in AA2, wherein the AA1 and AA2 are separated by shallow trench isolation structure 22.

In embodiments, a second pull-up transistor is present and is located in AA2, wherein the first pull-up transistor and the second pull-up transistor are both located on bottom dielectric isolation layer 25 that extends continuously beneath the first pull-up transistor and the second pull-up transistor.

In embodiments, the base portion B of the second backside contact structure 60B directly contacts a first surface of a VDD power supply.

In embodiments, the VDD power supply has a second surface opposite the first surface of the VDD power supply directly contacting backside interconnect structure.

In embodiments, the first backside contact structure 60A directly contacts a first surface of VSS power supply.

In embodiments, the VSS power supply has a second surface opposite the first surface of the VSS power supply directly contacting the backside interconnect structure.

In embodiments, the first pull-up transistor has gate structure 50, wherein the gate structure 50 of the first pull-up transistor is electrically connected to a second p-doped source/drain region 36 of the first pull-up transistor by cross-couple (XC) frontside contact structure 52A.

In embodiments, the cross-couple (XC) frontside contact structure 52A contacts frontside BEOL structure 54.

In embodiments, wherein the first pull-down transistor has gate structure 50, wherein the gate structure 50 of the first pull-down transistor is electrically connected to the frontside BEOL structure 54 by frontside gate contact structure 52B.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A static random access memory (SRAM) comprising:
a first pull-up transistor having a first channel length;
a first pull-down transistor located adjacent to the first pull-up transistor and having a second channel length, wherein the second channel length is greater than the first channel length;
a first backside contact structure contacting a first n-doped source/drain region of the first pull-down transistor, wherein the first backside contact structure has a first critical dimension that is constant throughout an entirety of the first backside contact structure; and
a second backside contact structure having a vertical portion and a base portion, wherein the vertical portion of the second backside contact structure directly contacts a first p-doped source/drain region of the first pull-up transistor and the base portion of the second backside contact structure has a second critical dimension that is greater than the first critical dimension.

2. The SRAM of claim 1, wherein the vertical portion of the second backside contact structure has a third critical dimension, wherein the third critical dimension is less than both the first critical dimension and the second critical dimension.

3. The SRAM of claim 1, wherein the n-doped source/drain region of the first pull-down transistor is confined between a pair of dielectric spacers.

4. The SRAM of claim 1, wherein the p-doped source/drain region of the first pull-up transistor is confined on a first side by a dielectric spacer and on a second side by a double diffusion break structure.

5. The SRAM of claim 4, wherein the double diffusion break structure directly contacts a surface of the base portion of the second backside contact structure.

6. The SRAM of claim 1, wherein the first pull-down transistor is located in a first active area and the first pull-up transistor is located in a second active area, wherein the first active area and the second active area are separated by a shallow trench isolation structure.

7. The SRAM of claim 6, further comprising a second pull-up transistor located in the second active area, wherein the first pull-up transistor and the second pull-up transistor are both located on a bottom dielectric isolation layer that extends continuously beneath the first pull-up transistor and the second pull-up transistor.

8. The SRAM of claim 1, wherein the base portion of the second backside contact structure directly contacts a first surface of a VDD power supply.

9. The SRAM of claim 8, wherein the VDD power supply has a second surface opposite the first surface of the VDD power supply directly contacting a backside power distribution network.

10. The SRAM of claim 9, wherein the first backside contact structure directly contacts a first surface of a VSS power supply.

11. The SRAM of claim 10, wherein the VSS power supply has a second surface opposite the first surface of the VSS power supply directly contacting the backside power distribution network.

12. The SRAM of claim 1, wherein the first pull-up transistor has a gate structure, wherein the gate structure of the first pull-up transistor is electrically connected to a second p-doped source/drain region of the first pull-up transistor by a cross-couple (XC) frontside contact structure.

13. The SRAM of claim 12, wherein the XC frontside contact structure contacts a frontside back-end-of-the-line (BEOL) structure.

14. The SRAM of claim 13, wherein the first pull-down transistor has a gate structure, wherein the gate structure of the first pull-down transistor is electrically connected to the frontside BEOL structure by a frontside gate contact structure.

15. A semiconductor structure comprising:
a p-type nanosheet transistor having a first channel length;
an n-type nanosheet transistor located adjacent to the p-type nanosheet transistor and having a second channel length, wherein the second channel length is greater than the first channel length;
a first backside contact structure contacting an n-doped source/drain region of the n-type nanosheet transistor, wherein the first backside contact structure has a first critical dimension that is constant throughout an entirety of the first backside contact structure;
a second backside contact structure having a vertical portion and a base portion, wherein the vertical portion of the second backside contact structure directly contacts a p-doped source/drain region of the p-type nanosheet transistor and the base portion of the second backside contact structure has a second critical dimension that is greater than the first critical dimension.

16. The semiconductor structure of claim 15, wherein the vertical portion of the second backside contact structure has a third critical dimension, wherein the third critical dimension is less than both the first critical dimension and the second critical dimension.

17. The semiconductor structure of claim 15, wherein the n-doped source/drain region of the n-type nanosheet transistor is confined on a first side by a dielectric spacer and on a second side by a double diffusion break structure.

18. The semiconductor structure of claim 17, wherein the double diffusion break structure directly contacts a surface of the base portion of the second backside contact structure.

19. The semiconductor structure of claim 15, wherein the base portion of the second backside contact structure directly contacts a first surface of a VDD power supply, and wherein a second surface of the VDD power supply that is opposite the first surface of the VDD power supply directly contacts a backside power distribution network, and wherein the first backside contact structure directly contacts a first surface of a VSS power supply and a second surface of the VSS power supply opposite the first surface of the VSS power supply directly contacts the backside power distribution network.

20. The semiconductor structure of claim 15, wherein the p-type nanosheet transistor has a gate structure, wherein the gate structure of the n-type nanosheet transistor is electrically connected to a second p-doped source/drain region of the n-type nanosheet transistor by a cross-couple (XC) frontside contact structure, and the XC frontside contact structure further contacts a frontside BEOL structure, and wherein the n-type nanosheet transistor is electrically connected to the frontside BEOL structure by a frontside gate contact structure.

\* \* \* \* \*